US008743649B2

(12) United States Patent
Sato

(10) Patent No.: US 8,743,649 B2
(45) Date of Patent: Jun. 3, 2014

(54) SEMICONDUCTOR MEMORY, SYSTEM, AND METHOD OF OPERATING SEMICONDUCTOR MEMORY

(75) Inventor: Takahiko Sato, Tachikawa (JP)

(73) Assignee: Fujitsu Semiconductor Limited, Yokohama (JP)

( * ) Notice: Subject to any disclaimer, the term of this patent is extended or adjusted under 35 U.S.C. 154(b) by 158 days.

(21) Appl. No.: 13/485,266

(22) Filed: May 31, 2012

(65) Prior Publication Data

US 2012/0327734 A1 Dec. 27, 2012

(30) Foreign Application Priority Data

Jun. 27, 2011 (JP) ................................. 2011-141846

(51) Int. Cl.
*G11C 5/14* (2006.01)

(52) U.S. Cl.
USPC ........ 365/227; 365/226; 365/185.23; 365/63; 365/194; 365/195; 365/230.01; 365/230.06; 365/233.14; 365/238; 365/238.5

(58) Field of Classification Search
USPC .............. 365/226, 185.23, 63, 194, 195, 227, 365/230.01, 230.06, 233.14, 238, 238.5
See application file for complete search history.

(56) References Cited

U.S. PATENT DOCUMENTS

| 6,807,083 | B2 * | 10/2004 | Yamamura ..................... 365/145 |
| 6,862,236 | B2 * | 3/2005 | Maruyama ..................... 365/202 |
| 6,927,751 | B2 * | 8/2005 | Ide et al. ......................... 345/67 |
| 7,586,807 | B2 | 9/2009 | Noda |
| 7,974,140 | B2 | 7/2011 | Ogasawara |
| 2010/0142305 | A1 | 6/2010 | Lee |

FOREIGN PATENT DOCUMENTS

| JP | 2008-027547 A | 2/2008 |
| JP | 2008-117525 A | 5/2008 |
| JP | 2009-181638 A | 8/2009 |
| JP | 2010-135047 A | 6/2010 |

* cited by examiner

*Primary Examiner* — Fernando Hidalgo
(74) *Attorney, Agent, or Firm* — Arent Fox LLP

(57) ABSTRACT

A memory has memory cells in a matrix; a first selection unit selecting any of first signal lines in the memory cells, in response to an access request; a second selection unit selecting any of second signal lines in the memory cells, after the first selection unit starts operating; a first voltage generation unit generating a first power supply voltage supplied to the first selection unit; a second voltage generation unit generating a second power supply voltage supplied to the second selection unit, when a start-up signal is active; a switch short-circuiting first and second power supply lines, when a short-circuit signal is active; and a power supply voltage control unit which activates the start-up signal in response to the access request, activates the short-circuit signal after a predetermined time elapses since activation of the start-up signal, deactivates the short-circuit signal and the start-up signal after completion of access operations.

16 Claims, 18 Drawing Sheets

SEMICONDUCTOR MEMORY, SYSTEM, AND METHOD OF OPERATING SEMICONDUCTOR MEMORY

CROSS-REFERENCE TO RELATED APPLICATIONS

This application is based upon and claims the benefit of priority of the prior Japanese Patent Application No. 2011-141846, filed on Jun. 27, 2011, the entire contents of which are incorporated herein by reference.

FIELD

The present embodiment relates to a semiconductor memory having a low power consumption mode and a system in which the semiconductor memory is mounted.

BACKGROUND

A method is proposed by which in a semiconductor memory such as a DRAM, if row-related and column-related circuit blocks do not operate, supply of a power supply voltage to those circuit blocks is stopped to thereby reduce a leakage current flowing through the inoperative circuit blocks (see, for example, Japanese Patent Application Laid-Open Nos. 2008-27547 and 2010-135047). Another method is proposed by which in a DRAM, an operating frequency is recognized on the basis of a column address strobe (CAS) latency set in a mode register to change a capacity of generating an internal power supply voltage by using a voltage generation unit based on this recognized operating frequency, thereby reducing dissipation power (see, for example, Japanese Patent Application Laid-Open No. 2009-181638). A further method is proposed by which in a pseudo SRAM, when a standby mode in which refresh operations are performed is recovered from a deep standby mode in which the refresh operations are stopped, the operating frequency of the voltage generation unit generating the internal power supply voltage is increased to thereby rapidly set the internal voltage to a desired value (see, for example, Japanese Patent Application Laid-Open No. 2008-117525).

For example, in the case of forming a plurality of voltage generation units corresponding to circuit blocks respectively, the power supply voltage generation capacity of each of the voltage generation units is designed to match the maximum dissipation power of the corresponding circuit blocks. However, the plurality of circuit blocks are not always operating at the maximum dissipation power. If the voltage generation unit has an excessive power supply voltage generation capacity, the semiconductor memory has increased dissipation power.

SUMMARY

According to a first aspect of the embodiment, a semiconductor memory has memory cells disposed in a matrix; a first selection unit which selects any of first signal lines respectively connected to memory cell lines arranged in a first direction, in response to an access request to access the memory cells; a second selection unit which selects any of second signal lines respectively connected to the memory cell lines arranged in a second direction intersecting with the first direction, after the first selection unit starts operating; a first voltage generation unit which generates a first power supply voltage to be supplied to the first selection unit; a second voltage generation unit which generates a second power supply voltage to be supplied to the second selection unit, when a start-up signal is in an activating state; a switch which short-circuits a first power supply line supplied with the first power supply voltage and a second power supply line supplied with the second power supply voltage to each other, when a short-circuit signal is in the activating state; and a power supply voltage control unit which activates the start-up signal in response to the access request, activates the short-circuit signal after a predetermined time elapses since activation of the start-up signal, deactivates the short-circuit signal after completion of access operations based on the access request, and deactivates the start-up signal in response to deactivation of the short-circuit signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT(S)

The following will describe embodiments with reference to the drawings. A signal line through which signals are transmitted is given the same symbol as a signal name. The signal having "Z" at its end is based on the positive logic. The signal having "/" at its top or "X" at its end is based on the negative logic. In the figures, a double square mark denotes an external terminal. The external terminal is, for example, a pad in a semiconductor chip or a lead wire of a package housing the semiconductor chip. The signal supplied via the external terminal is given the same symbol as the terminal name.

Figure 1:
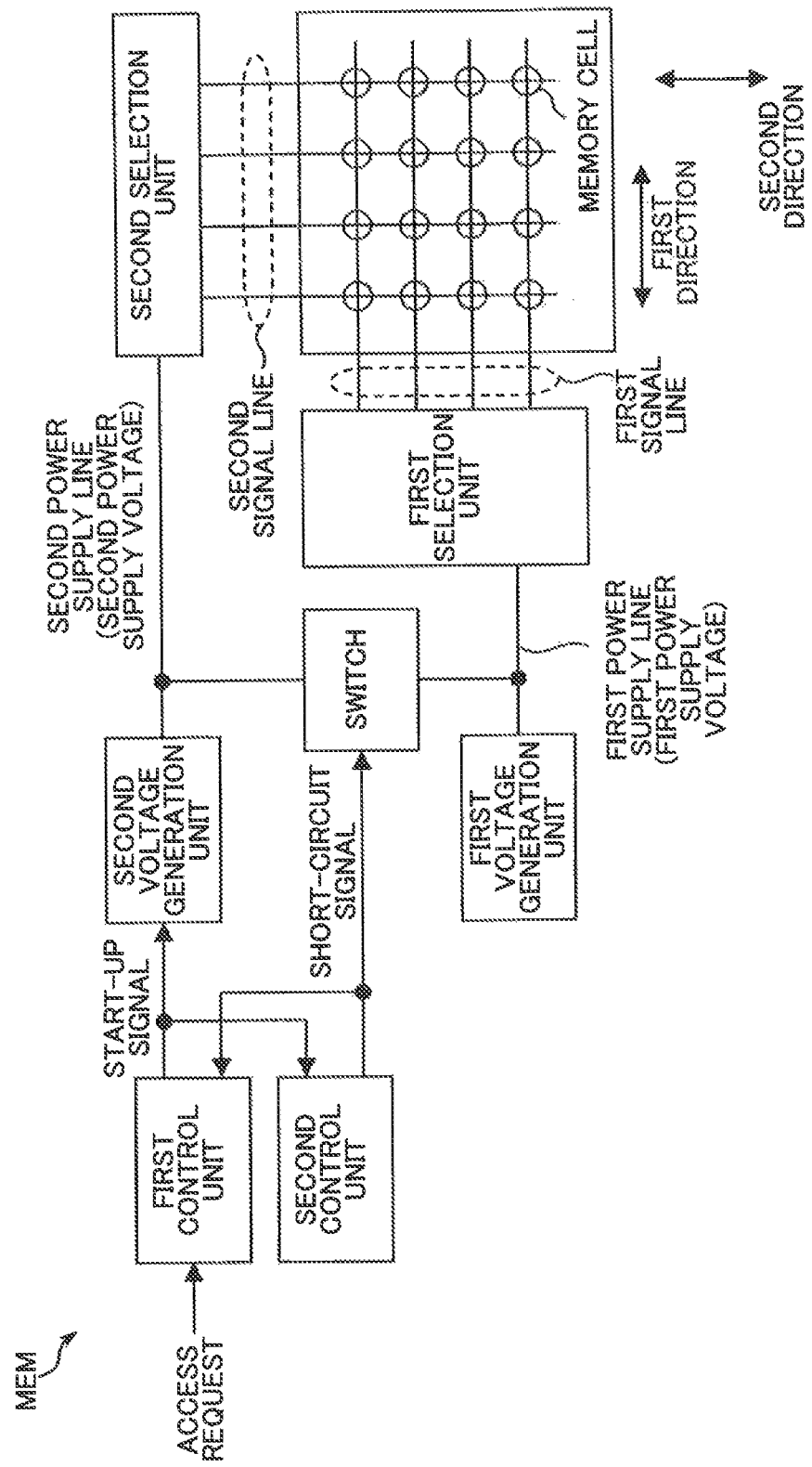
FIG. 1 illustrates an example of a semiconductor memory in one embodiment.

FIG. 1 illustrates an example of a semiconductor memory in one embodiment. The semiconductor memory has a plurality of memory cells disposed in a matrix, a first control unit, a second control unit, a first voltage generation unit, a second voltage generation unit, a switch, a first selection unit, and a second selection unit.

The first selection unit selects one of first signal lines connected to the respective memory-cell lines arranged in a first direction in response to an access request for memory cell access. The second selection unit selects one of second signal lines connected to the respective memory-cell lines arranged in a second direction intersecting with the first direction, after the first selection unit starts operations.

The first control unit activates a start-up signal in response to an access request. The second control unit activates the short-circuit signal after a predetermined time lapses since the activation of the start-up signal. The second control unit deactivates the short-circuit signal after completion of the access operation based on an access request. For example, the second control unit deactivates the short-circuit signal based on information denoting the completion of the access operations. And, the first control unit deactivates the start-up signal in response to deactivation of a short-circuit signal output from the second control unit. The first and second control units are a power supply control unit for controlling the second voltage generation unit and a switch.

The first voltage generation unit generates a first power supply voltage to be supplied to the first selection unit. The second voltage generation unit generates a second power supply voltage to be supplied to the second selection unit during the activation of the start-up signal and stops generation of the second power supply voltage during the deactivation of the start-up signal. That is, in response to an access request, the second voltage generation unit starts generation of the second power supply voltage before the second selection unit starts operating and stops the generation of the second power supply voltage when the second selection unit is not operating. Because the second power supply voltage is generated when the second selection unit is operating, dissipation power of the semiconductor memory is reduced.

The switch short-circuits the first power supply line supplied with the first power supply voltage and the second power supply line supplied with the second power supply voltage to each other during the activation of the short-circuit signal. The short-circuit signal is generated in retard of the start-up signal, such that at a time when the first power supply line and the second power supply line are short-circuited by the switch, the second power supply voltage is already up to a predetermined voltage. It is thus possible to prevent the first power supply voltage from fluctuating by the effects of the second power supply voltage when the switched is turned on. Further, when the switch is in the on-state, the second selection unit operates by utilizing not only the second power supply voltage but also the first power supply voltage generated by the first voltage generation unit. Thus, the second power supply voltage generation capacity of the second voltage generation unit is minimized, thereby reducing the circuit scale of the second voltage generation unit.

The switch disconnects the first and second power supply lines from each other when the short-circuit signal is inactive. It is thus possible to prevent a current from flowing to the second power supply line in the floating state from the first power supply line after the second selection circuit is stopped in operation, the access operations are completed, and the second voltage generation unit is stopped. Therefore, it is possible to prevent the first voltage generation unit from operating uselessly, thereby reducing the dissipation power of the semiconductor memory.

As may be seen from the above, according to the present embodiment, Fluctuations in first power supply voltage and second power supply voltage is prevented and, at the same time, the first power supply voltage generation capacity of the first voltage generation unit and the second power supply voltage generation capacity of the second voltage generation unit are minimized respectively. As a result, the dissipation power of the semiconductor memory is reduced.

Figure 2:
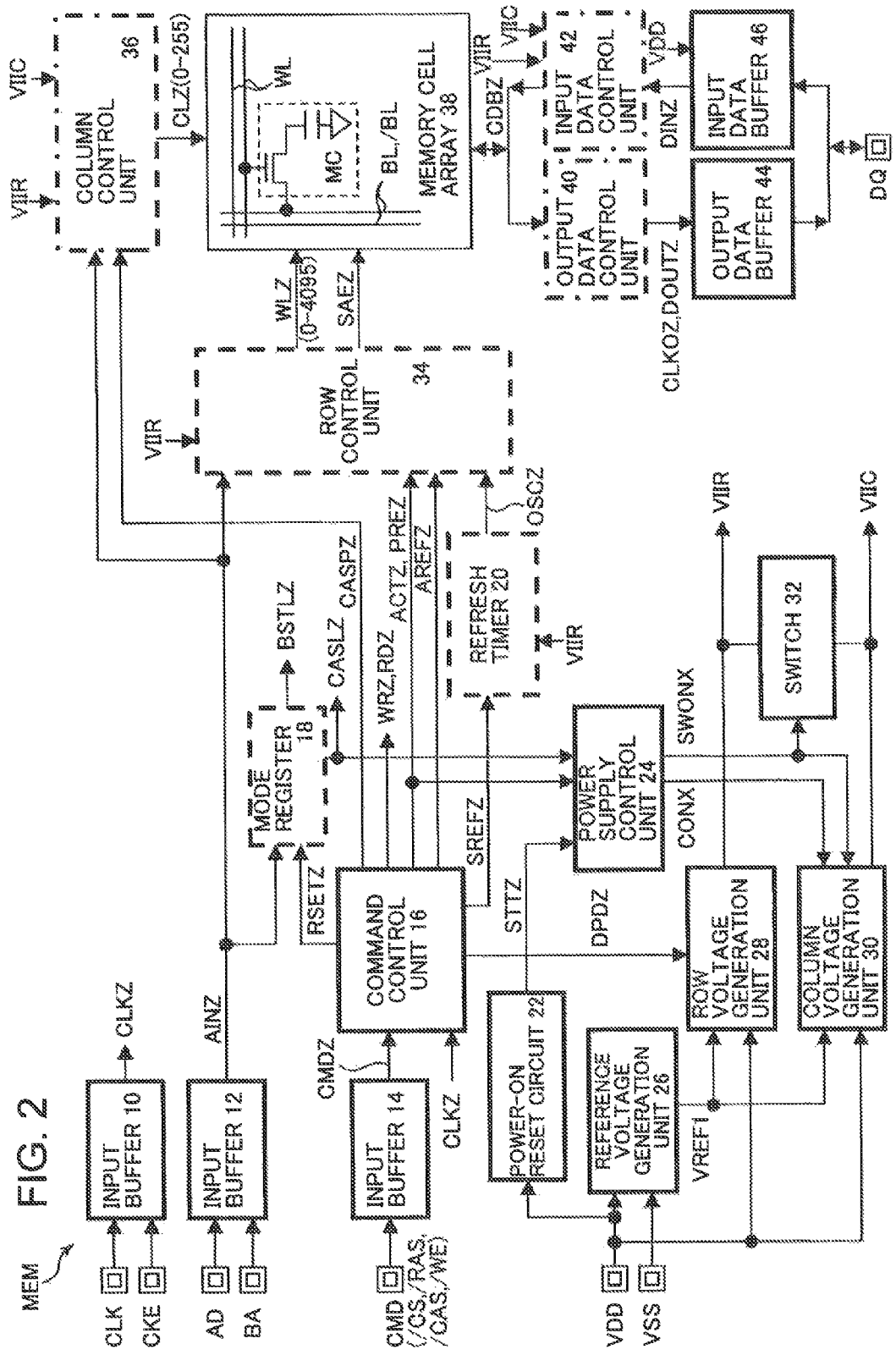
FIG. 2 illustrates an example of a semiconductor memory MEM in another embodiment.

FIG. 2 illustrates an example of a semiconductor memory MEM in another embodiment. In those embodiments, identical reference numerals are given to identical components, and description thereof will not be repeated here. For example, a semiconductor memory MEM is a synchronous dynamic random access memory (SDRAM). The semiconductor memory MEM may be designed as a packaged-sealed semiconductor memory or a memory macro (IP) mounted in a system LSI etc.

The semiconductor memory MEM has input buffers 10, 12, and 14, a command control unit 16, a mode register 18, a refresh timer 20, a power-on reset circuit 22, a power supply control unit 24, a reference voltage generation unit 26, a row voltage generation unit 28, a column voltage generation unit 30, a switch 32, a row control unit 34, a column control unit 36, a memory cell array 38, an output data control unit 40, an input data control unit 42, an output data buffer 44, and an input data buffer 46.

A circuit block denoted by a bald solid line operates as it receives a power supply voltage VDD supplied from an outside of the semiconductor memory MEM. A circuit block denoted by a broken line operates as it receives an internal power supply voltage VIIR. A circuit block denoted by a bald dash-and-dot line operates as it receives an internal power supply voltage VIIC. A circuit block denoted by both of a bald broken line and a bald dash-and-dot line includes some circuits that operate as they receive the power supply voltage VIIR and the other circuits that operate as they receive the internal power supply voltage VIIC.

For example, the column control unit 36, the output data control unit 40, and the input data control unit 42 operate as they receive the internal power supply voltages VIIR and VIIC. The memory cell array 38 is not denoted by a thin solid line because it does not directly receive the power supply voltage VDD or the internal power supply voltage VIIR or VIIC.

The input buffer 10 outputs a clock signal CLK as a clock signal CLKZ when it is receiving a high-level CLOCK ENABLE signal CKE. The input buffer 10 stops outputting the clock signal CLKZ when it is receiving the low-level CLOCK ENABLE signal CKE.

The input buffer 12 receives an address signal AD and a bank address signal BA via address terminals AD and BA respectively, to output the received signals as an address signal AINZ. For ease of explanation, a bank selected by the bank address BA is omitted in description to illustrate the memory cell array 38 instead.

The semiconductor memory MEM of the present embodiment employs an address multiplex type in which a row address signal RA and a column address signal CA are received by using the common address terminal AD at different timings. The address signal line AINZ is used to transmit the row address signal RA and the column address signal CA. The row address signal RA is output to the row control unit 34 in order to select a word line WL. The column address signal CA is output to the column control unit 36 in order to select bit lines BL and /BL.

The input buffer 14 receives a command signal CMD to output the received signal as a command signal CMDZ. For example, the command signals CMD include a CHIP SELECT signal /CS, a row address strobe signal /RAS, a column address strobe signal /CAS, and a WRITE ENABLE signal /WE.

The command control unit 16 receives the command signal CMDZ in synchronization with the clock signal CLKZ to decode the received command signal CMDZ. In response to results of the decoding, the command control unit 16 outputs an activate signal ACTZ, a pre-charge signal PREZ, a write signal WRZ, a read signal RDZ, and a column control signal CASPZ in order to gain access to the memory cell array 38. Further, in response to the results of the decoding, the command control unit 16 outputs a register set signal RSETZ, an auto refresh signal AREFZ, a self-refresh signal SREFZ, a deep power-down signal DPDZ, etc.

When an activate command is received at a command terminal CMD, the activate signal ACTZ is generated to operate the row control unit 34, thereby activating the word line WL. The activate command is one example of the access request for the purpose of gaining access to a memory cell MC in order to perform write or read operations.

The pre-charge signal PREZ is generated to deactivate the word line WL when a pre-charge command is received at the command terminal CMD. The pre-charge command is supplied to the semiconductor memory MEM to complete write or read operations and access operations to the memory cell MC.

The write signal WRZ is generated to perform write operations when a write command is received at the command terminal CMD when the activate signal ACTZ is in the activated state. The read signal RDZ is generated to perform read operations when a read command is received at the command terminal CMD when the activate signal ACTZ is in the activated state. The column control signal CASPZ is generated to operate the column control unit 36 so that a bit line pair BL and /BL may be selected when the write or read command is received at the command terminal CMD.

A register set signal RSETZ is generated to set the mode register 18 when a register set command is received at the command terminal CMD. The auto refresh signal AREFZ is generated to perform refresh operations when a refresh command is received at the command terminal CMD. The self-refresh signal SREFZ is generated to shift the semiconductor memory MEM into a self-refresh mode when a self-refresh command is received at the command terminal CMD. In the self-refresh mode, read and write operations are prohibited to periodically perform refresh operations by using the refresh timer 20.

Figure 7:
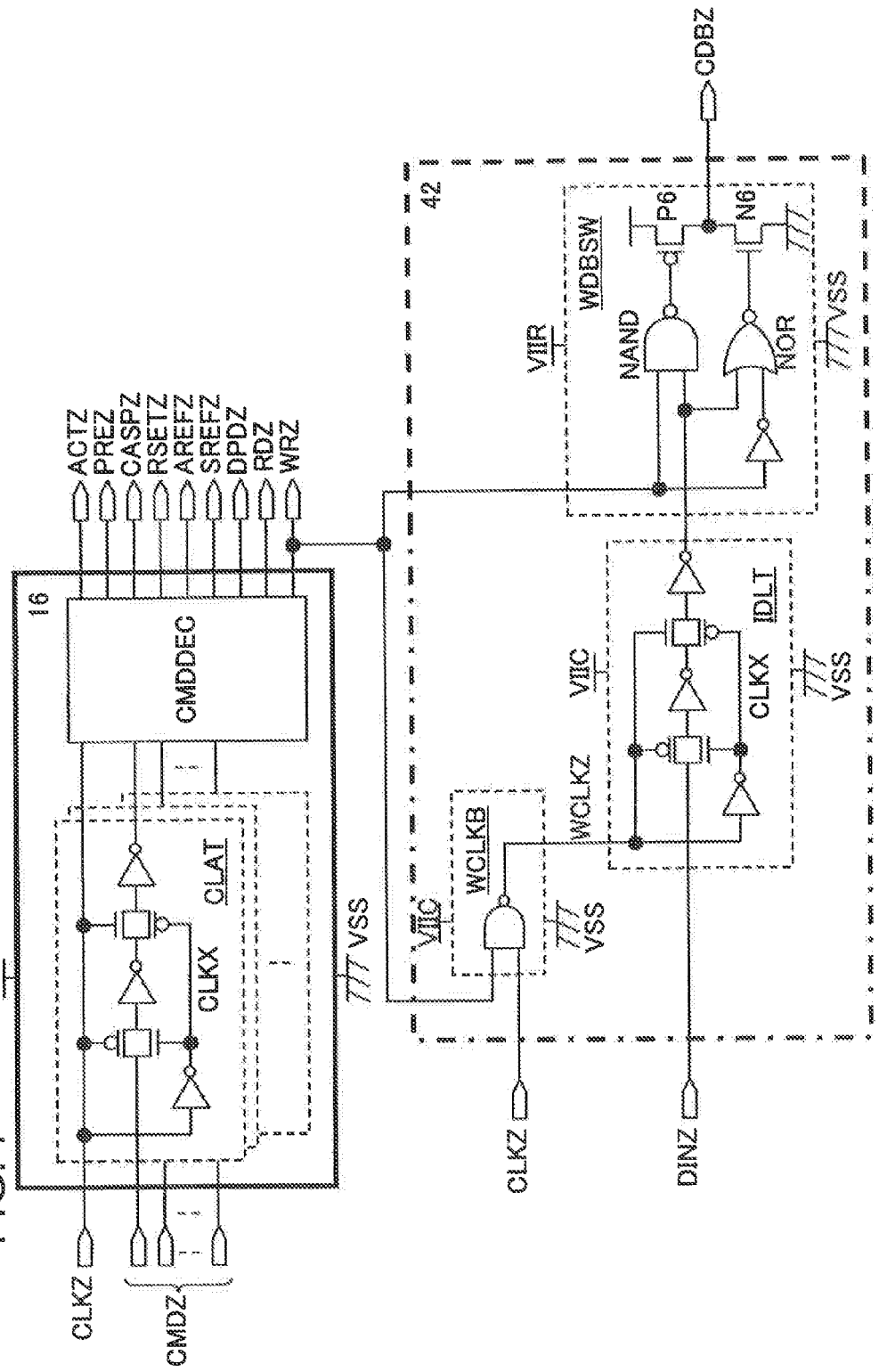
FIG. 7 illustrates an example of the command control unit 16 and the input data control unit 42 illustrated in FIG. 2.

The deep power-down signal DPDZ is deactivated when the clock signal CLKZ is being received and activated when it is not being received. In other words, when the clock enable signal CKE is set to the low level and the clock signal CLKZ is not generated, the deep power-down signal DPDZ is activated to the high level in order to shift the semiconductor memory MEM into a deep power-down mode. In the deep power-down mode, which is an operation mode in which dissipation power is minimized, generation of the internal power supply voltages VIIR and VIIC is stopped, such that data held in the memory cells MC is lost. An example of the command control unit 16 is illustrated in FIG. 7.

The mode register 18 has a plurality of register regions which are set in accordance with the value of the address signal AINZ received along with the register set signal RSETZ. The mode register 18 outputs a latency signal CASLZ, a burst signal BSTLZ, etc. The value of the latency signal CASLZ denotes latency, which is the number of clock cycles counted from a time when the read command is supplied to a time when the first data is output. The value of the burst signal BSTLZ denotes the number of data pieces which are continually read from the semiconductor memory MEM in response to one read command or the number of data pieces which are continually written into the semiconductor memory MEM in response to one write command. The more register 18 is one example of a register that sets the number of clock cycles as counted from a time when the internal circuit such as the column control unit 36 is started in operation to a time when a data signal is output to a data terminal DQ.

The refresh timer 20 operates when the self-refresh signal SREFZ is in the activated state, to output an oscillation signal OSCZ at a predetermined cycle. The oscillation signal OSCZ is an internal refresh request for the purpose of performing self-refresh operations.

The power-on reset circuit 22 activates a starter signal STTZ when the power supply voltage VDD is a predetermined value or less and deactivates it when the power supply voltage VDD exceeds the predetermined value. For example, if supply of the power supply voltage VDD to the semiconductor memory MEM is started and its value increases, the starter signal STTZ is temporarily activated to the high level.

Figure 4:
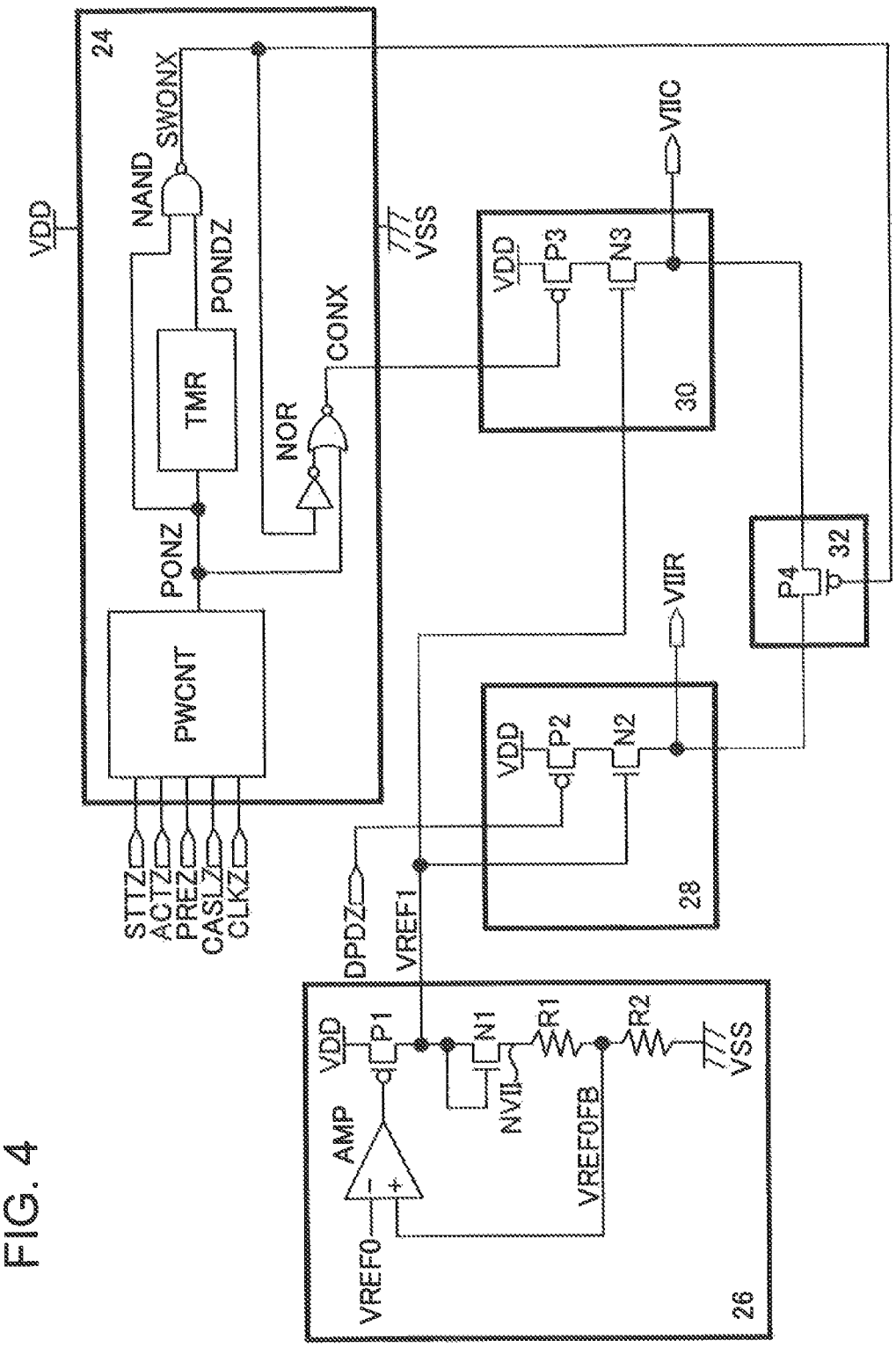
FIG. 4 illustrates examples of the power supply control unit 24, the reference voltage generation unit 26, the row voltage generation unit 28, the column voltage generation unit 30, and the switch 32 which are illustrated in FIG. 2.

The power supply control unit 24 outputs a start-up signal CONX and a short-circuit signal SWONX in response to the activate signal ACTZ, the pre-charge signal PREZ, and the latency signal CASLZ. An example of the power supply control unit 24 is illustrated in FIG. 4. The power supply control unit 24 corresponds to the first and second control units in FIG. 1.

The reference voltage generation unit 26 generates a reference voltage VREF1 based on the power supply voltage VDD. The row voltage generation unit 28 generates the internal power supply voltage VIIR based on the power supply voltage VDD when the deep power-down signal DPDZ is in the deactivated state and stops generating the internal power supply voltage VIIR when the deep power-down signal DPDZ is in the activated state. The row voltage generation unit 28 is one example of a first voltage generation unit which generates the internal power supply voltage VIIR to be supplied to the row control unit 34.

The column voltage generation unit 30 generates the internal power supply voltage VIIC when the start-up signal CONX is in the activated state and stops generating the internal power supply voltage VIIC when the start-up signal CONX is in the deactivated state. The column voltage generation unit 30 is one example of a second voltage generation unit which generates the internal power supply voltage to be supplied to the column control unit 36 when the start-up signal CONX is in the activated state.

The switch 32 connects the internal power supply voltage lines VIIR and VIIC to each other when the short-circuit signal SWONX is in the activated state and separates the internal power supply voltage lines VIIR and VIIC from each other when the short-circuit signal SWONX is in the deactivated state. Examples of the reference voltage generation unit 26, the row voltage generation unit 28, the column voltage generation unit 30, and the switch 32 are illustrated in FIG. 4.

Figure 3:
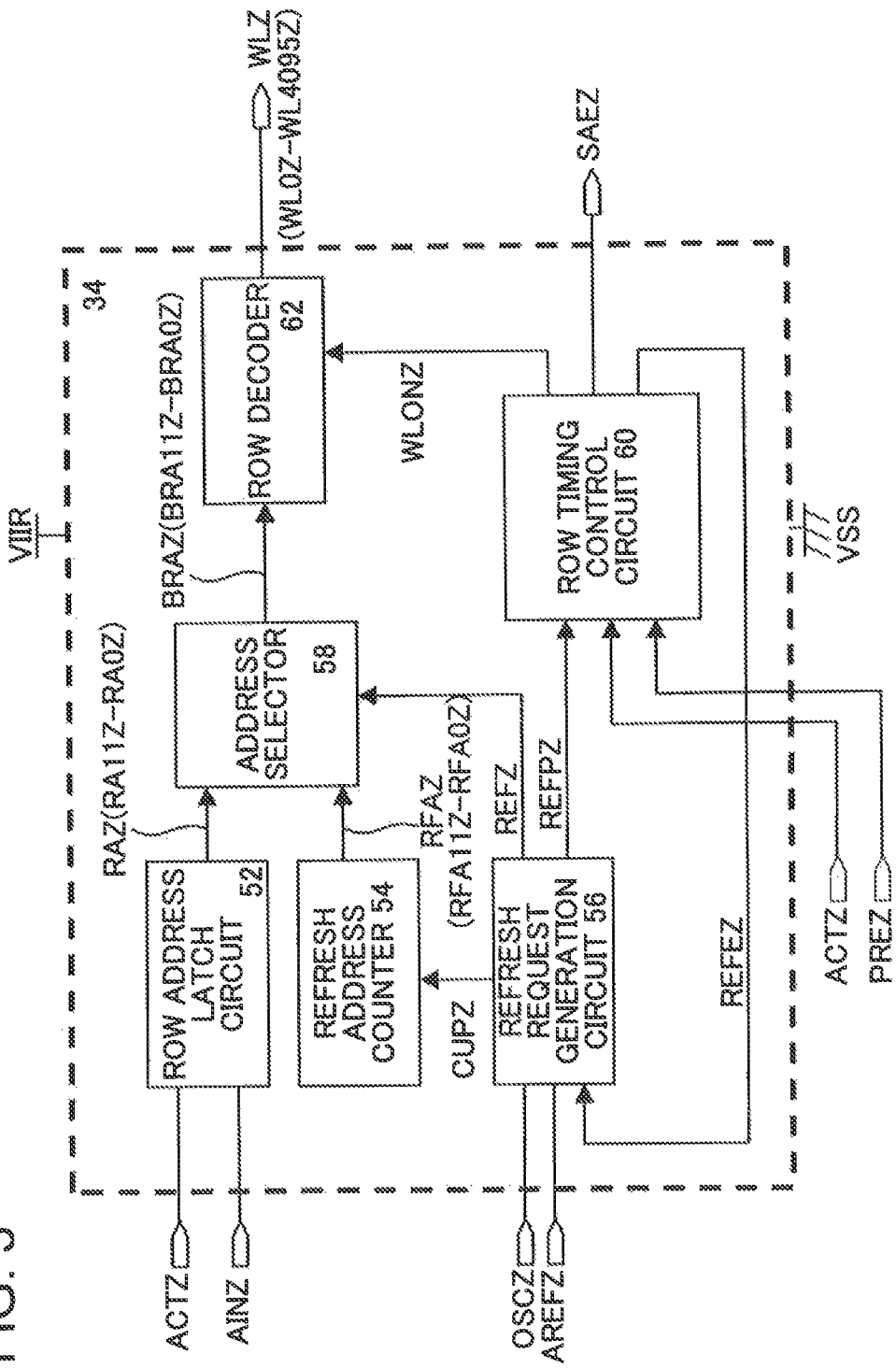
FIG. 3 illustrates an example of the row control unit 34 illustrated in FIG. 2.

The row control unit 34 receives the row address signal transmitted to the address signal line AINZ in response to the activate signal ACTZ, to activate one of the word lines WLZ (WL0Z-WL4095Z) in accordance with the received row address signal. In response to the activation of the word line signal WLZ, any one of the word lines WL is activated. Further, the row control unit 34 activates a sense-amplifier control signal SAEZ in response to the activate signal ACTZ. The row control unit 34 deactivates the word line signal WLZ and the sense-amplifier control signal SAEZ in response to the pre-charge signal PREZ. The row control unit 34 is one example of a first selection unit which selects any one of the word lines WL respectively connected to the lines of the memory cells MC arranged horizontally in the figure, in response to an access request for the purpose of gaining access to the memory cell MC. An example of the row control unit 34 is illustrated in FIG. 3.

The column control unit 36 operates as it receives the internal power supply voltages VIIR and VIIC. The column control unit 36 receives a column address transmitted to the address signal line AINZ in response to the column control signal CASPZ, to activate any one of the column line select signals CLZ (CL0Z-CL255Z) in accordance with the received column address. In response to the activation of the column line select signal CLZ, a column switch is turned on to select a predetermined number of bit line pairs BL and /BL. Then, data pieces are input to the selected bit line pair BL and /BL or data pieces are read from the selected bit line pair BL and /BL. The column control unit 36 is one example of a second selection unit which selects one of the bit line pair BL and /BL respectively connected to the lines of the memory cells MC vertically arranged in the figure after the row control unit 34 is started in operation.

The memory cell array 38 has the plurality of dynamic memory cells MC arranged in a matrix, the plurality of word lines WL connected to the line of the memory cells MC arranged horizontally in the figure, and the complementary bit line pairs BL and /BL connected to the lines of the memory cells MC arranged horizontally in the figure. The memory cell MC has a capacitor to hold data as charge and a transfer transistor to connect one end of the capacitor to the bit line BL (or /BL). The other end of the capacitor is a reference voltage line.

Figure 8:
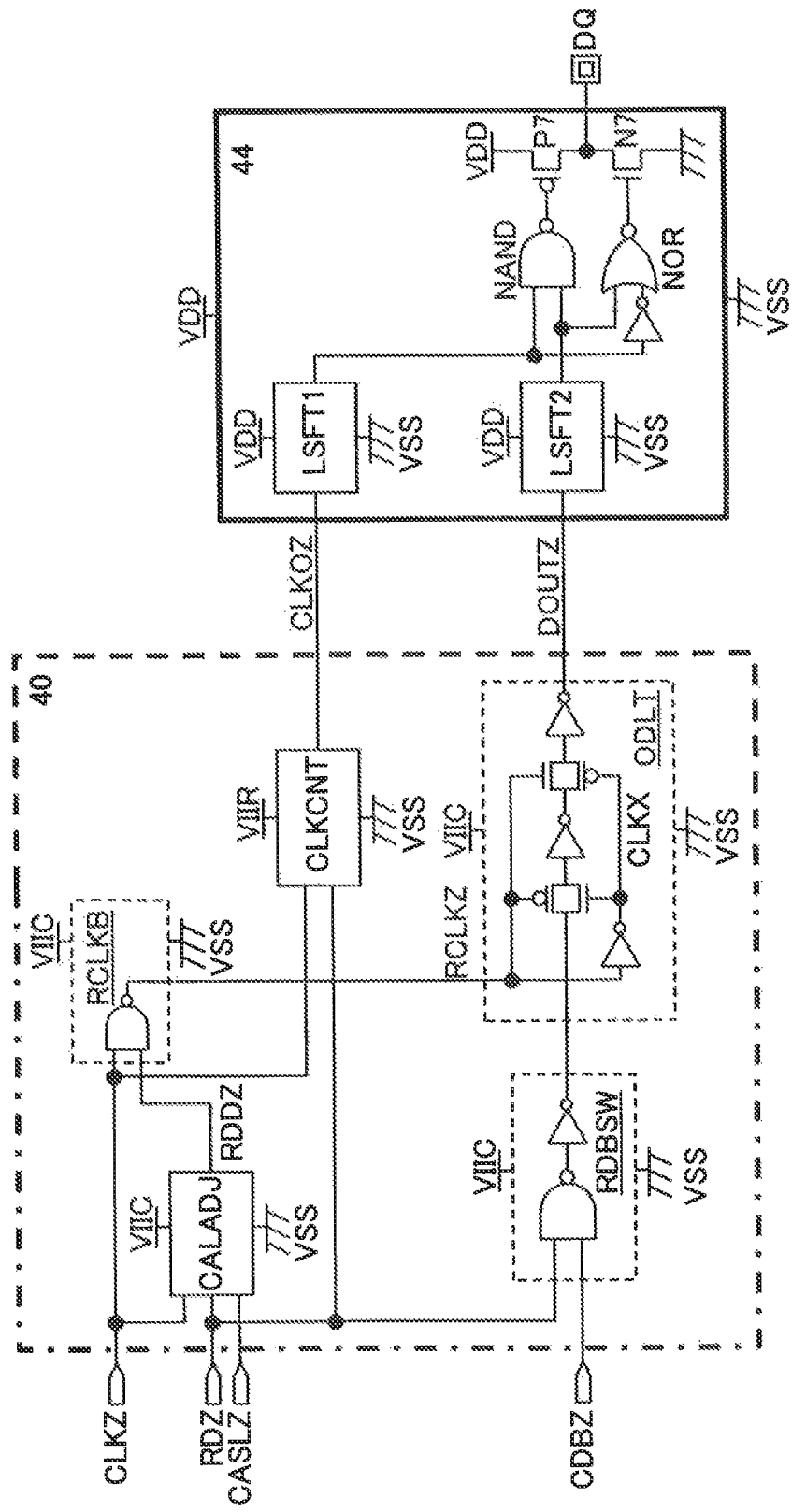
FIG. 8 illustrates an example of the output data control unit 40 and the output data buffer 44 illustrated in FIG. 2; f

The output data control unit 40 operates as it receives the internal power supply voltages VIIR and VIIC. The output data control unit 40 outputs a data signal output from the memory cell array 38 via a common data line CDBZ to the output data buffer 44 as an output data signal DOUTZ in a read operation mode. Further, the output data control unit 40 supplies the output data buffer 44 with an output clock signal CLKOZ which operates the output data buffer 44. An example of the output data control unit 40 is illustrated in FIG. 8.

The input data control unit 42 operates as it receives the internal power supply voltages VIIR and VIIC. The input data control unit 42 outputs an input data signal DINZ received from the input data buffer 46 to the common data line CDBZ. An example of the input data control unit 42 is illustrated in FIG. 7.

The output data buffer 44 operates in the read operation mode, to output the output data signal DOUTZ to the data terminal DQ in response to the output clock signal CLKOZ. An example of the output data buffer 44 is illustrated in FIG. 8. The input data buffer 46 operates in the read operation mode, to output data received at the data terminal DQ to the input data control unit 42 as the input data DINZ.

FIG. 3 illustrates an example of the row control unit 34 illustrated in FIG. 2. The row control unit 34 has a row address latch circuit 52, a refresh address counter 54, a refresh request generation circuit 56, an address selector 58, a row timing control circuit 60, and a row decoder 62.

The row address latch circuit 52 receives and latches the address signal AINZ in response to the activate signal ACTZ, to output a row address signal RAZ (RA11Z-RA0Z). The refresh address counter 54 performs count operations in response to a count-up signal CUPZ, to generate a refresh address signal RFAZ (RFA11Z-RFA0Z). The row address signal RAZ and the refresh address signal RFAZ are not limited to the length of 12 bits.

The refresh request generation circuit 56 outputs the count-up signal CUPZ and the refresh pulse signal REFPZ in response to the oscillation signal OSCZ or the auto refresh mode signal AREFZ, to activate the refresh signal REFZ. The count-up signal CUPZ and the refresh pulse signal REFPZ are each a pulse signal. Further, the refresh request generation circuit 56 deactivates the refresh signal REFZ in response to a refresh end signal REFEZ.

The address selector 58 selects the row address signal RAZ when the refresh signal REFZ is in the deactivated state and selects the refresh address signal RFAZ when the refresh signal REFZ is in the activated state and outputs the selected signal as the row address signal BRAZ (BRA11Z-BRA0Z). The row timing control circuit 60 activates a word line control signal WLONZ and a sense-amplifier control signal SAEZ in response to the activate signal ACTZ or the refresh pulse signal REFPZ. The row timing control circuit 60 deactivates the word line control signal WLONZ and the sense-amplifier control signal SAEZ in response to the pre-charge signal PREZ. Further, the row timing control circuit 60 temporarily activates the refresh end signal REFEZ in response to the pre-charge signal PREZ.

The row decoder 62 activates one of the word line signals WLZ (WL0Z-WL4095Z) in response to the row address signal BRAZ. The number of the word line signals WLZ is not limited to 4096.

FIG. 4 illustrates examples of the power supply control unit 24, the reference voltage generation unit 26, the row voltage generation unit 28, the column voltage generation unit 30, and the switch 32 which are illustrated in FIG. 2. The power supply control unit 24 has a power supply control circuit PWCNT, an NOR gate, a timer TMR, and an NAND gate.

Figure 5:
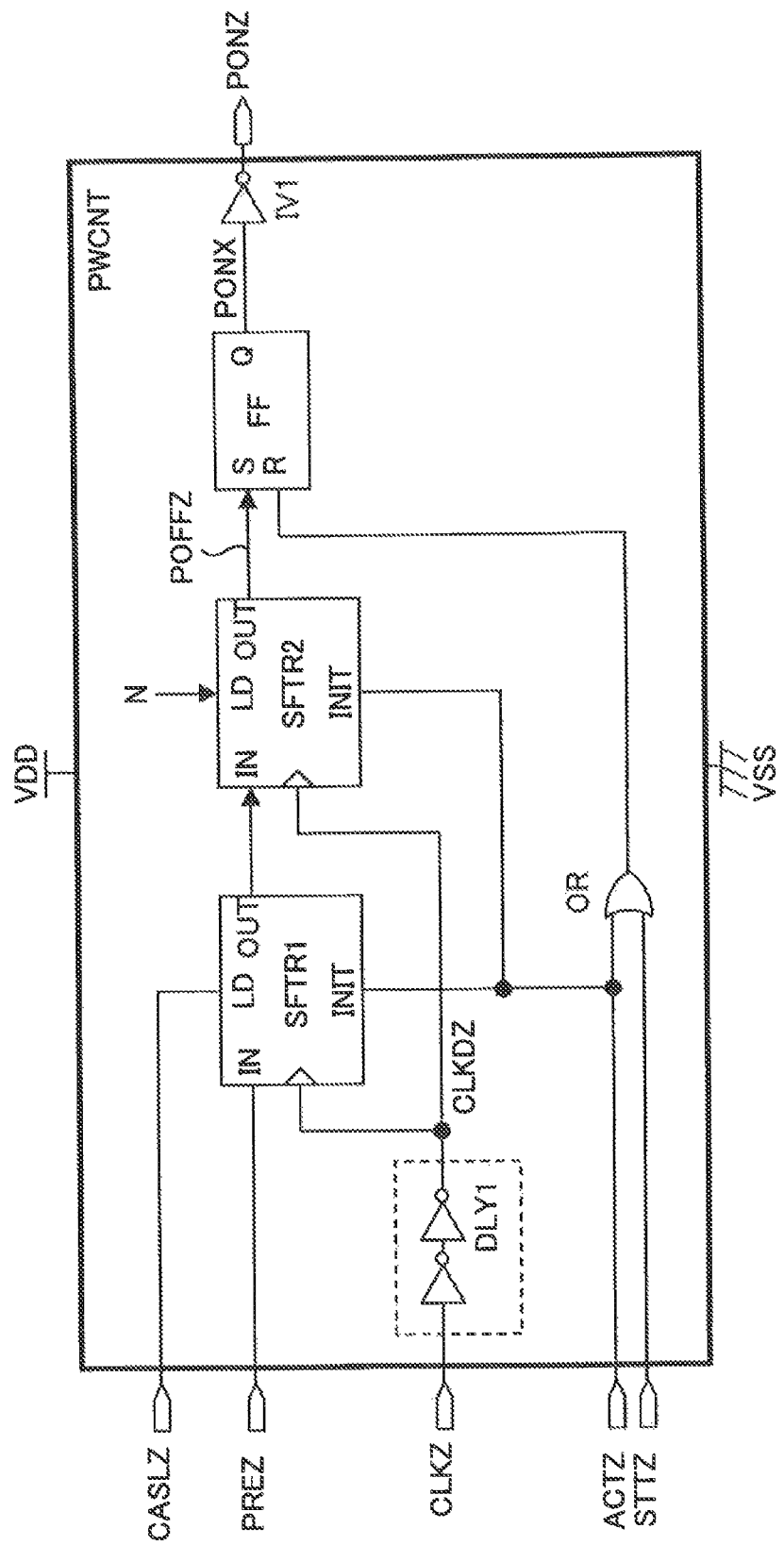
FIG. 5 illustrates an example of the power control circuit PWCNT illustrated in FIG. 4.

The power supply control circuit PWCNT outputs a power-on signal PONZ in response to the activate signal ACTZ, the pre-charge signal PREZ, and the latency signal CASLZ. An example of the power supply control circuit PWCNT is illustrated in FIG. 5.

The NOR gate outputs the low-level (active) activate signal CONX when it receives the high-level (active) power-on signal PONZ or the low-level (active) shirt-circuit signal SWONX via an inverter. The NOR gate outputs the high-level (inactive) activate signal CONX if it receives the low-level (inactive) power-on signal PONZ and the high-level (inactive) short-circuit signal SWONX via the inverter. The power supply control circuit PWCNT and the NOR gate are one example of the first control unit which activates the start-up signal CONX if it receives a memory cell MC access request and deactivates the start-up signal CONX in response to deactivation of the short-circuit signal SWONX.

Figure 6:
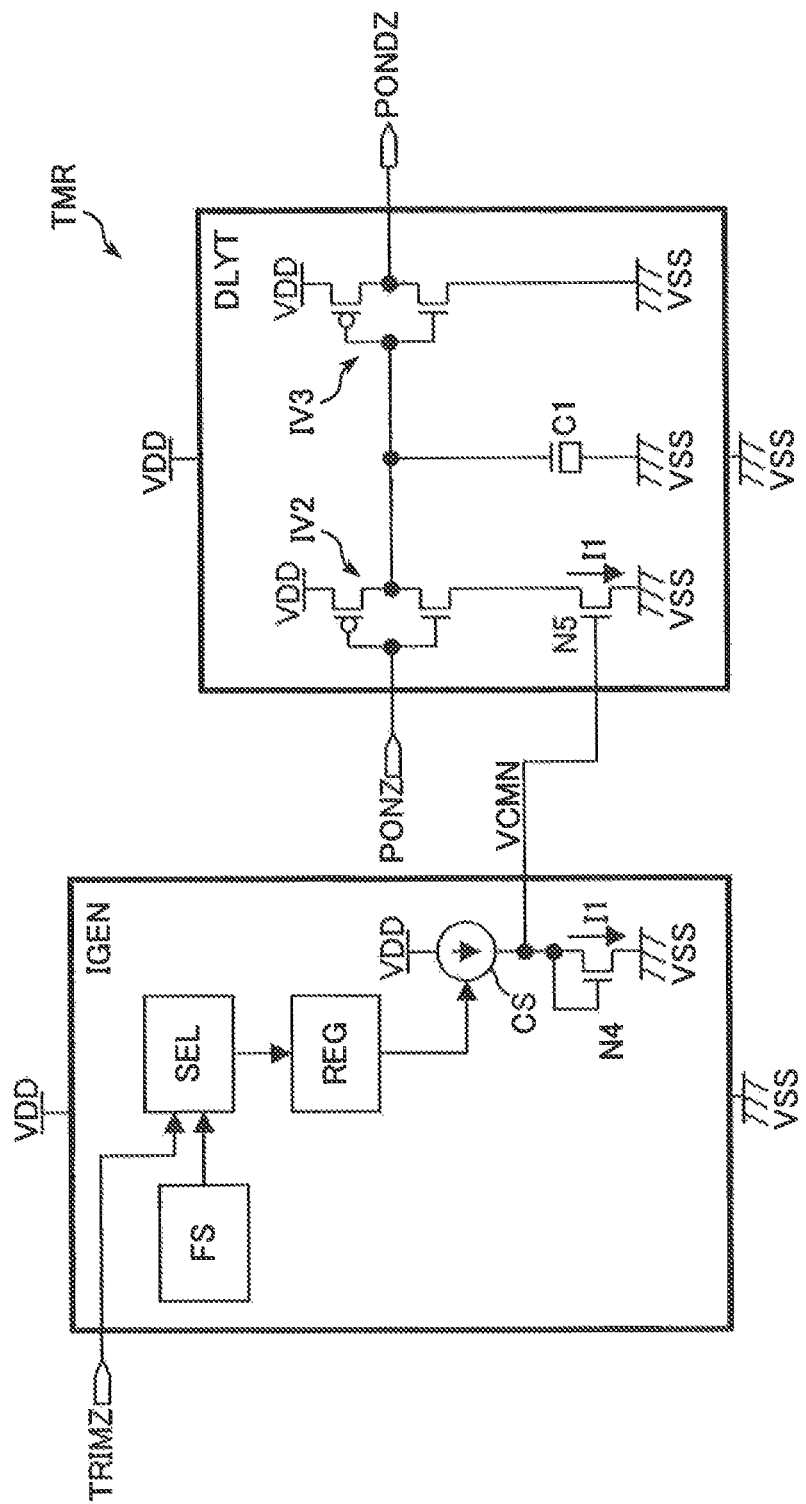
FIG. 6 illustrates an example of the timer TMR illustrated in FIG. 4.

The timer TMR generates a H-level (active) delay power-on signal PONDZ by delaying the H-level (active) power-on signal PONZ. An example of the timer TMR is illustrated in FIG. 6. The NAND gate activates the short-circuit signal SWONX in response to the activation of the delay power-on signal PONDZ and deactivates the short-circuit signal SWONX in response to the deactivation of the power-on signal PONZ. The NAND gate may activate the short-circuit signal SWONX in response to the activation of a signal generated from the activate signal ACTZ denoting an access request in place of the delay power-on signal PONDZ. The timer TMR and the NAND gate are one example of the second control unit which activates the short-circuit signal SWONX after a predetermined time elapses since the activation of the start-up signal CONX and deactivates the short-circuit signal SWONX after the completion of access operations in response to an access request.

The reference voltage generation unit 26 has a differential amplifier AMR and a pMOS transistor P1, an nMOS transistor N1, and resistor elements R1 and R2 which are disposed in series between the power supply line VDD and a ground line VSS. The differential amplifier AMP receives a reference voltage VREF0 at its one input (−) and a voltage VREF0FB divided by the resistor elements R1 and R2 at the other input (+) thereof. The differential amplifier AMP outputs a control voltage to the gate of the pMOS transistor P1 such that the divided voltage VREF0FB may be equal to the reference voltage VREF0.

The reference voltage VREF0 is an optimized constant voltage that is generated in the semiconductor memory MEM in order to stabilize its operations. The nMOS transistor N1 is diode-connected to operate as a threshold voltage monitor circuit. The nMOS transistor N1 supplies its drain node with a reference voltage VREF1 which is higher than a source voltage NVII by a threshold voltage.

The row voltage generation unit 28 has a pMOS transistor P2 and an nMOS transistor N2 which are disposed in series between the power supply line VDD and the internal power supply line VIIR. The pMOS transistor P2 is supplied with the deep power-down voltage DPDZ at its gate. The pMOS transistor P2 is turned off when it is supplied with the high-level deep power-down signal DPDZ (in the deep power-down mode) and turned on when it is supplied with the low-level deep power-down signal DPDZ.

The nMOS transistor N2 is supplied with the reference voltage VREF1 at its gate. The nMOS transistor N2 is designed such that its threshold voltage may be equal to that of the nMOS transistor N1. Therefore, the internal power supply voltage VIIR takes on a value lower than the reference voltage VREF1 by the threshold voltage. That is, the internal power supply voltage VIIR is equal to a source voltage NVII of the reference voltage generation unit 26.

The column voltage generation unit 30 has a pMOS transistor P3 and an nMOS transistor N3 which are disposed in series between the power supply line VDD and the internal power supply line VIIC. The pMOS transistor P3 is supplied with the start-up signal CONX at its gate and turned on when the start-up signal CONX is at the low level (active) and turned off when it is at the high level (inactive). The nMOS transistor N3 is supplied with the reference voltage VREF1 at its gate. The nMOS transistor N3 is designed such that its threshold voltage may be equal to that of the nMOS transistor N1. Therefore, the internal power supply voltage VIIC takes on a value lower than the reference voltage VREF1 by the threshold voltage. Accordingly, the internal power supply voltages VIIR and VIIC are equal to the source voltage NVII of the reference voltage generation unit 26.

The switch 32 has a pMOS transistor P4 which has its source and drain connected to the internal power supply voltages VIIR and VIIC respectively and is supplied with the short-circuit signal SWONX at its gate. When supplied with the low-level (active) short-circuit signal SWONX, the pMOS transistor P4 is turned on to connect the internal power supply voltages VIIR and VIIC to each other. When supplied with the high-level (inactive) short-circuit signal SWONX, the pMOS transistor P4 separates the internal power supply voltages VIIR and VIIC from each other. In response to the H-level (active) power off signal POFFZ, which is generated after a predetermined clocks (CASL+N) from the precharge command PRE at the end of the column side operation corresponding to the read command RD or the write command RW, the power on signal PONZ is inactivated (L-level); in response to PONZ=H, the short-circuit signal SWONX is deactivated (H-level), the switch 32 turns to OFF, the start-up signal COMX is deactivated (L-level); and the column voltage generation unit 30 shuts down the second power supply voltage VIIC. Therefore, when the active signal ACTZ is activated (H-level), the column voltage generation unit 30 starts up; after the second power supply voltage VIIC raises, the switch 32 turns ON so that the first and second power supply voltages VIIR, VIIC are connected. And, after the predetermined clock cycles from the completion of the column side operation, the switch 32 turns OFF and the column voltage generation unit 30 turns OFF. That is, the column voltage generation unit 30 generates the second power supply voltage VIIC during the column side operation, so that the power is reduced.

FIG. 5 illustrates an example of the power control circuit PWCNT illustrated in FIG. 4. The power control circuit PWCNT has a delay circuit DLY1, shift registers SFTR1 and SFTR2, a flip-flop FF, an inverter IV1, and an OR circuit. The delay circuit DLY1 generates a clock signal CLKDZ by delaying the clock signal CLKZ. The shift register SFTR1 is set to the same number of stages as a value of the latency signal CASLZ supplied at a load terminal LD if it is supplied with the leading edge of the activate signal ACTZ at an initialization terminal INIT. Then, it performs shift operations by synchronizing the high level of the pre-charge signal PREZ with the clock signal CLKDZ, to set an output terminal OUT to the high level after elapsing of the same number of clock cycles as the set number of stages. The shift register SFTR1 performs shift operations in synchronization with the clock signal CLKDZ obtained by delaying the clock signal CLKZ. In such a manner, as to be described in FIG. 10, it is possible to start operations of the shift register SFTR1 in synchronization with the leading edge of the clock signal CLK receiving the pre-charge command PRE.

The shift register SFTR2 is set to the same number of stages as a value N supplied at the load terminal LD if it is supplied with the leading edge of the activate signal ACTZ at the initialization terminal INIT. Then, it performs shift operations by synchronizing the high level from the shift register SFTR1 with the clock signal CLKDZ, to output a high-level power-off signal POFFZ from the output terminal OUT after elapsing of the same number of clock cycles as the set number of stages. For example, the value N is set to a fixed value of "4" and programmed beforehand by a photo-mask wiring pattern or fuse circuit used to manufacture the semiconductor memory MEM.

Figure 10:
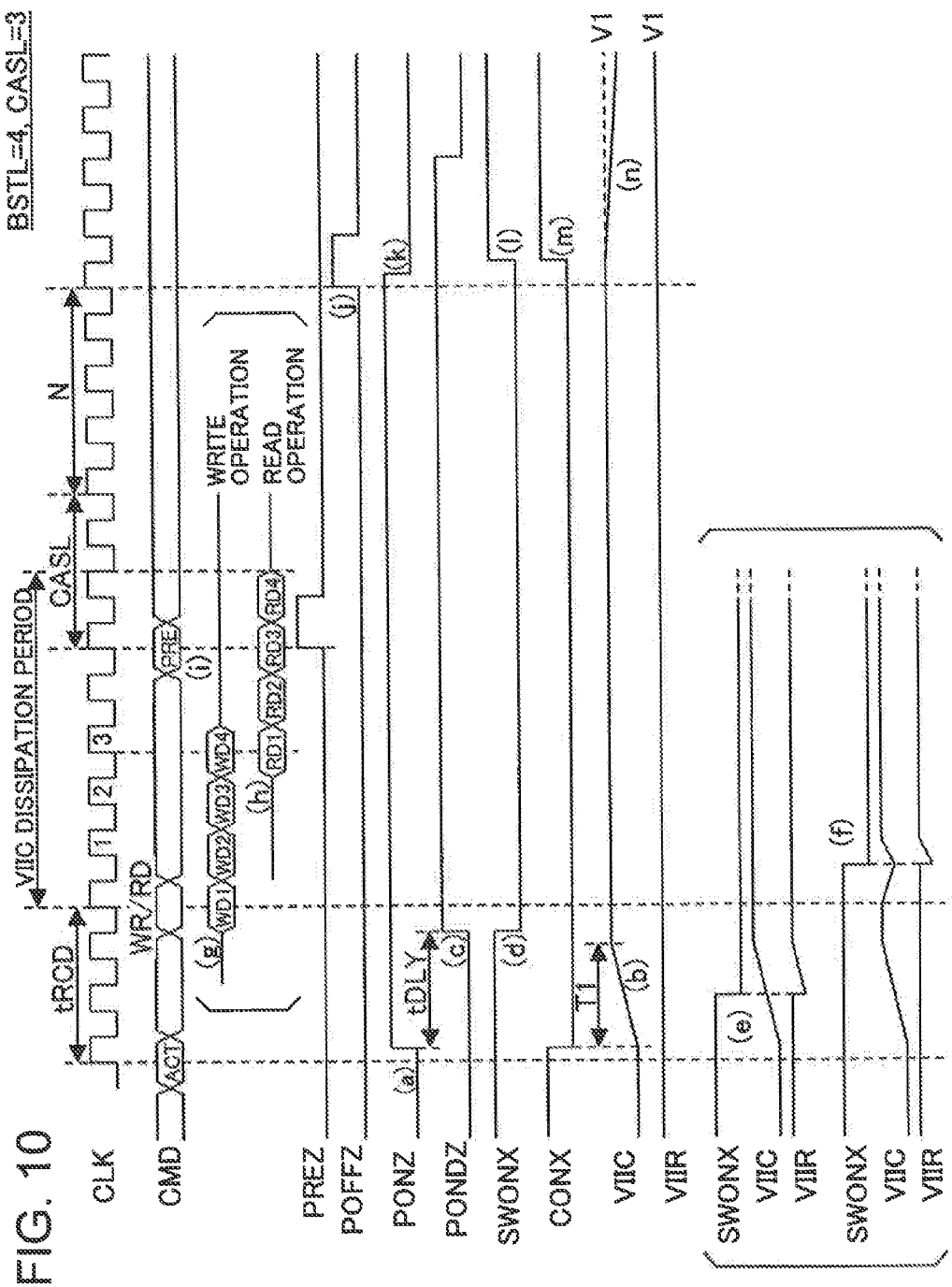
FIG. 10 illustrates an example of operations of the semiconductor memory MEM illustrated in FIG. 2.

The flip-flop FF activates the power-on signal PONX to the low level if it is supplied with the high level of the activate signal ACTZ via the OR circuit or the high level of the starter signal STTZ at a reset terminal R. The flip-flop FF deactivates the power-on signal PONX to the low level at an output terminal Q if it is supplied with the high level of the power-off signal POFFZ at a set terminal S. The inverter IV1 inverts the logic of the power-on signal PONX to output it as the power-on signal PONZ. The above power supply voltage control circuit PWCNT operates as follows. As illustrated in FIG. 10, in response to the activation (H-level) of the active signal ACTZ, the flip-flop FF is reset and the power-on signal PONZ becomes active (H-level). As the result, as explained in FIG. 4, the start-up signal CONX becomes active (L-level), the column side second power supply voltage VIIC raises, and the short circuit signal SWONX becomes active (L-level) to turn on the switch 32. On the other hand, when completing the column side operation, the precharge signal PREZ becomes active (H-level), and after the clock cycles of CAS latency (CASLZ=3) and N=4, the power-on signal PONZ becomes inactive (L-level). As the result, as explained in FIG. 4, the short circuit signal SWONX becomes inactive (H-level) to turn off the switch 32, and further the start-up signal CONX becomes inactive (H-level) so that the second power supply voltage VIIC falls down.

FIG. 6 illustrates an example of the timer TMR illustrated in FIG. 4. The timer TMR has a constant current generation circuit IGEN and a delay circuit DLYT. The constant current generation circuit IGEN has a fuse circuit FS, a selector SEL, a register REG, a current source CS, and a diode-connected nMOS transistor N4. The current source CS and nMOS transistor N4 are disposed in series between the power supply line VDD and the ground line VSS. The constant current generation circuit IGEN generates a constant voltage VCMN in accordance with a current flowing through the current supply CS.

The selector SEL selects either a value programmed in the fuse circuit FS or a trimming value TRIMZ and set it in the register REG. The current source CS generates a current in accordance with the value set in the register REG. For example, the trimming value TRIMZ is supplied via a test terminal during testing in a process of manufacturing the semiconductor memory MEM. The selector SEL selects a trimming value TRIMZ in the testing time and a value in the fuse circuit FS in a time other than the testing time. For example, if having taken in a value in the fuse circuit FS upon power-on of the semiconductor memory MEM, the register REG replace it by a trimming value TRIMZ in the testing time. It is thus possible to obtain an optimal delay time of the delay circuit DLYT from the trimming value TRIMZ and program it in the fuse circuit FS in the testing time.

The delay circuit DLYT has two CMOS inverters IV2 and IV3 connected in series and a capacitor element C1, which form a so-called CR delay circuit. The capacitor element C1 is formed by connecting the source and the drain of an nMOS transistor to each other in such a configuration that its gate may be connected to the output of the CMOS inverter IV2 and its source and drain may be connected to the ground line VSS. The CMOS inverter IV3 is configured to output the power-on signal PONDZ.

The CMOS inverter IV2 has its source connected to the ground line VSS via an nMOS transistor N5. The nMOS transistors N4 and N5 are designed such that they may have the same characteristics. The nMOS transistors N5 has the same gate voltage and source voltage (current-mirror connected) as those of the nMOS transistor N4 in the constant current generation circuit IGEN. Accordingly, the nMOS transistors N4 and N5 have the same current I1 flowing through themselves.

Assuming here that a discharge current flowing through the nMOS transistor N5 is I1, a capacitance value of the capacitor element C1 is C1, and a logical threshold value of the CMOS transistor IV3 is VDD/2, a delay time T1 of the delay circuit DLYT is given by Equation (1). By optimally setting the discharge current I1 by using the constant current generation circuit IGEN, the delay time T1 is made almost constant irrespective of fluctuations in conditions of manufacturing the semiconductor memory MEM.

$$T1 = C1 \times (VDD/2)/I1 \quad (1)$$

The delay circuit DLYT delays the leading edge of the power-on signal PONZ by the delay time T1, to thereby generate the leading edge of the short-circuit signal SWONX via the power-on signal PONDZ. That is, the delay circuit DLYT activates the short-circuit signal SWONX after the delay time T1 elapses since the activation of the power-on signal PONZ. As illustrated in FIG. 4, the NOR gate in the power supply control unit 24 activates the start-up signal CONX in response to the activation of the power-on signal PONZ. Accordingly, a difference between timing at which the power-on signal PONZ is activated and timing at which the short-circuit signal SWONX is activated is the delay time T1, which is negligible. That is, the delay circuit DLYT activates the short-circuit signal SWONX after the delay time T1 since the activation of the start-up signal CONX.

FIG. 7 illustrates an example of the command control unit 16 and the input data control unit 42 illustrated in FIG. 2. The command control unit 16 has a command latch circuit CLAT and a command decoder CMDDEC each of which receives the command signal CMDZ. Each of the command latch circuits CLAT has CMOS transfer gates disposed in series between an input and an output, an inverter, a CMOS transfer gate, and an inverter. Each command latch circuit CLAT receives the command signal CMDZ in the low-level period of the clock signal CLKZ and latches the command signal CMDZ in synchronization with the leading edge of the clock signal CLKZ to output it to the command decoder CMDDEC.

The command decoder CMDDEC decodes the command signal CMD output from the command latch circuit CLAT and outputs the activate signal ACTZ, the pre-charge signal PREZ, the column control signal CASPZ, the register set signal RSETZ, the auto refresh signal AREFZ, the self-refresh signal SREFZ, the read signal RDZ, and the write signal WRZ. Further, the command decoder CMDDEC activates the deep power-down signal DPDZ when the clock signal CLKZ is not oscillated.

The input data control unit 42 has a write clock buffer WCLKB, an input data latch circuit IDLT, and a write data bus switch WDBSW. FIG. 7 illustrates the input data control unit 42 corresponding to one data terminal DQ (DINZ). The write clock buffer WCLKB generates a write clock signal WCLKZ in synchronization with the clock signal CLKZ when the write signal WRZ is activated at the high level. For example, the write clock signal WCLKZ is activated the number of clock cycles corresponding to a burst length.

The input data latch circuit IDLT is the same as the command latch circuit CLAT. The input data latch circuit IDLT receives the input data signal DINZ in the low-level period of the write clock signal WCLKZ, to and latch the input data DINZ in synchronization with the leading edge of the write clock signal WCLKZ and output it to the write data bus switch WDBSW.

The write data bus switch WDBSW has a pMOS transistor P6 and an nMOS transistor N6 connected between the internal power supply line VIIR and the ground line VSS, an NAND gate and an NOR gate. The pMOS transistor P6 has its gate connected to the output of the NAND gate. The nMOS transistor N6 has its gate connected to the output of the NOR gate. The NAND gate and the NOR gate are turned on if they are supplied with the high-level (active) write signal WRZ.

The NAND gate and the NOR gate invert the logic of the input data signal DINZ supplied via the input data latch circuit IDLT and output it to the pMOS transistor P6 and the nMOS transistor N6 respectively. If the input data signal DINZ is at the high level, the pMOS transistor P6 is turned on and the nMOS transistor N6 is turned off, to set a common data line CDBZ to the high level. If the input data signal DINZ is at the low level, the pMOS transistor P6 is turned off and the nMOS transistor N6 is turned on, to set the common data line CDBZ to the low level. When supplied with the low-level (inactive) write signal WRZ, the write data bus switch WDBSW turns off the pMOS transistor P6 and the nMOS transistor N6 in order to set the common data line CDBZ into the floating state. In order to do so, the first power supply voltage VIIR is supplied to the write data bus switch WDBSW.

The write clock buffer WCLKB and the input data latch circuit IDLT operate in a period when the internal power supply voltage VIIC is generated when the pMOS transistor P3 illustrated in FIG. 4 is turned on. The write clock buffer WCLKB and the input data latch circuit IDLT stop operating in a period when the internal power supply voltage VIIC is not generated when the pMOS transistor P3 is turned off. The write data bus switch WDBSW operates as it receives the internal power supply voltage VIIR generated in a period except in the deep power-down mode. The pMOS transistor P6 and the nMOS transistor N6 are turned off by the low-level (inactive) write signal WRZ. Accordingly, it is possible to prevent the write data bus switch WDBSW from malfunctioning when the write clock buffer WCLKB and the input data latch circuit IDLT are stopped in operation.

FIG. 8 illustrates an example of the output data control unit 40 and the output data buffer 44 illustrated in FIG. 2. FIG. 8 illustrates the output data control unit 40 and the output data buffer 44 corresponding to one data terminal DQ. The output data control unit 40 has a latency adjustment circuit CALADJ, a read clock buffer RCLKB, an output clock control circuit CLKCNT, a read data bus switch RDBSW, and an output data latch ODLT.

The latency adjustment circuit CALADJ delays the read signal RDZ by the number of clock cycles corresponding to a value of the latency signal CASLZ and outputs it as a delay read signal RDDZ to the read clock buffer RCLKB. The read clock buffer RCLKB outputs the read clock signal RCLKZ in synchronization with the clock signal CLKZ in the high-level (active) period of the delay read signal RDDZ. For example, the read clock signal RCLKZ is activated the number of times corresponding to a burst length. The output clock control circuit CLKCNT outputs the output clock signal CLKOZ in synchronization with the clock signal CLKZ in the high-level (active) period of the read signal RDZ.

The read data bus switch RDBSW outputs the read data signal read to the common data line CDBZ to the output data latch circuit ODLT in a period when the read signal RDZ is at the high level (active). The output data latch circuit ODLT is the same as the command latch circuit CLAT illustrated in FIG. 7. The output data latch circuit ODLT receives the read data signal in the low-level period of the read clock signal RCLKZ, to latch the read data signal in synchronization with the leading edge of the read clock signal RCLKZ and output it as the output data signal DOUTZ to the output data buffer 44. The output data latch circuit ODLT latches the output of the common data line CDBZ in synchronized with the read out clock signal RCLKZ which changes H and L-level in burst length times.

The output data buffer 44 has level shifters LSFT1 and LSFT2, a pMOS transistor P7 and an nMOS transistor N7 connected between the power supply line VDD and the ground line VSS, an NAND gate, and an NOR gate. The level shifter LSFT1 converts the high level of the output clock signal CLKOZ from the internal power supply voltage VIIR into the power supply voltage VDD. The level shifter LSFT2 converts the high level of the output data signal DOUTZ from the internal power supply voltage VIIC into the power supply voltage VDD.

The pMOS transistor P7 has its gate connected to the output of the NAND gate. The nMOS transistor N7 has its gate connected to the output of the NOR gate. The NAND gate and NOR gate are validated when supplied with the high-level output clock signal CLKOZ. Further, the NAND gate and NOR gate invert the logic of the output data signal DOUTZ supplied via the level shifter LSFT1 and output it to the pMOS transistor P7 and the nMOS transistor N7 respectively.

If the output data signal DOUTZ is at the high level, the pMOS transistor P7 is turned on and the nMOS transistor N7 is turned off to set the data terminal DQ to the high level. If the output data signal DOUTZ is at the low level, the pMOS transistor P7 is turned off and the nMOS transistor N7 is turned on to set the data terminal DQ to the low level. If supplied with the low-level output clock signal CLKOZ, the output data buffer 44 turns off the pMOS transistor P7 and the nMOS transistor N7 to set the data terminal DQ into the floating state. That is, while the read-out signal RDZ is L-level (inactive), the data terminal DQ becomes high impedance state, and while the read-out signal RDZ is H-level (active), the data terminal DQ becomes the same logic level as the output data signal DOUTZ.

The latency adjustment circuit CALADJ, the read clock buffer RCLKB, the read data bus switch RDBSW, and the output data latch ODLT operate in a period when the column internal power supply voltage VIIC is generated and stop operations in a period when the internal power supply voltage VIIC is not generated. The output clock control circuit CLKCNT operates as it receives the internal power supply voltage VIIR generated in a period except in the deep power-down mode. The output clock control circuit CLKCNT receives the low-level read signal RDZ in the period when the row internal power supply voltage VIIC is not generated, to set the output clock signal CLKOZ to the low level. The pMOS transistor P7 and the nMOS transistor N7 in the output data buffer 44 are turned off by the low-level output clock signal CLKOZ, so that the data terminal DQ becomes the high impedance state. Accordingly, it is possible to prevent the output data buffer 44 from malfunctioning when the latency adjustment circuit CALADJ, the read clock buffer RCLKB, the read data bus switch RDBSW, and the output data latch ODLT are stopped in operation.

Figure 9:
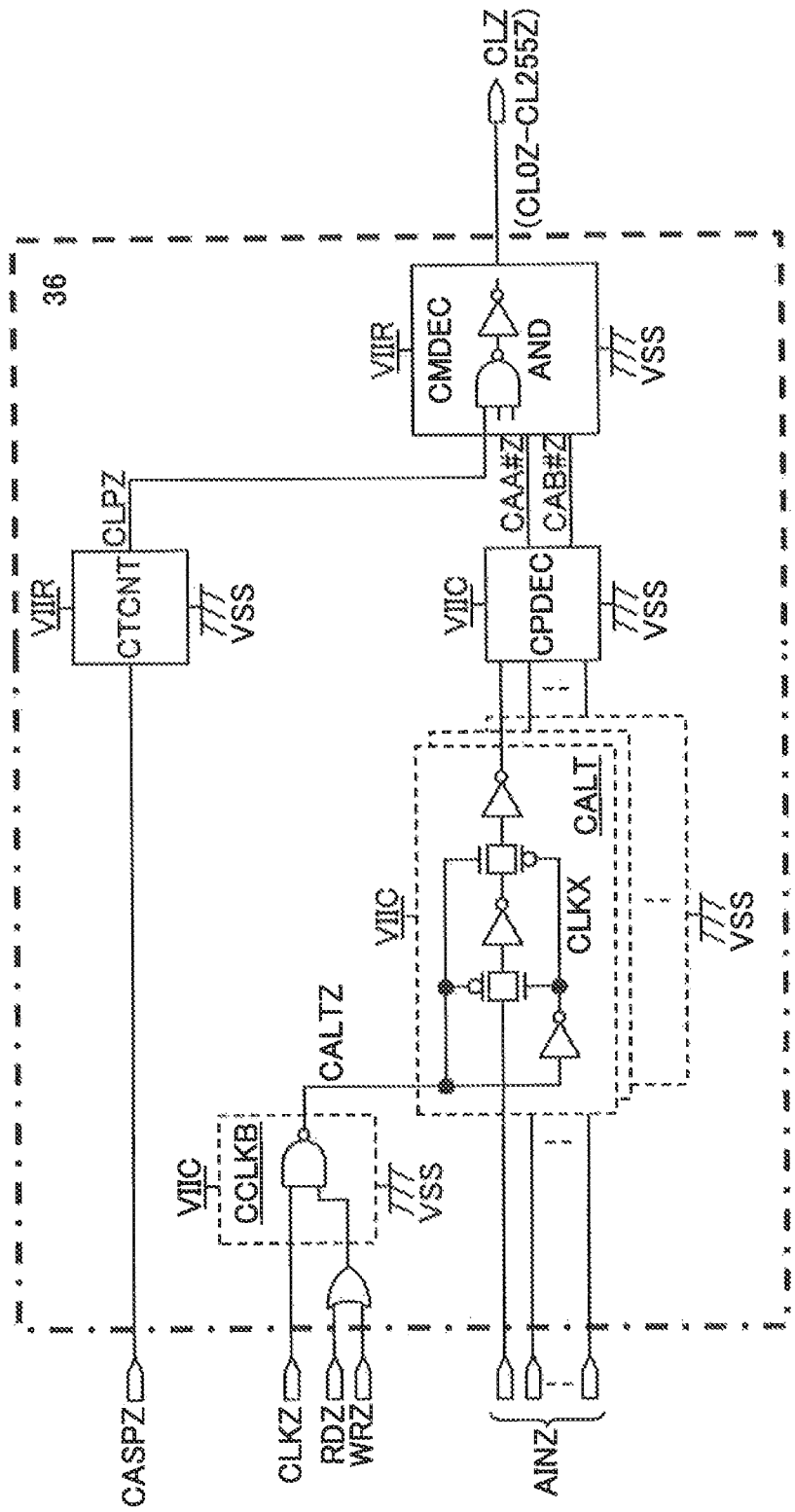
FIG. 9 illustrates an example of the column control unit 36 illustrated in FIG. 2.

FIG. 9 illustrates an example of the column control unit 36 illustrated in FIG. 2. The column control unit 36 has a column timing control circuit CTCNT, a column clock buffer CCLKB, a column address latch circuit CALT, a column pre-decoder CPDEC, and a column main decoder CMDEC.

The column timing control circuit CTCNT outputs the column control signal CASPZ as a column pulse signal CLPZ. The column clock buffer CCLKB generates a latch signal CALTZ in synchronization with the clock signal CLKZ when the write signal WRZ or the read signal RDZ is activated at the high level.

The column address latch circuit CALT is the same as the command latch circuit CLAT illustrated in FIG. 7. The column address latch circuit CALT receives the address signal AINZ in the low-level period of the latch signal CALTZ, to latch the address signal AINZ in synchronization with the leading edge of the latch signal CALTZ and output it to the column pre-decoder CPDEC.

The column pre-decoder CPDEC pre-decodes the address signal AINZ latched in the column address latch circuit CALT, to generate pre-decode signals CAA#Z (for example, CAA0Z-CAA15Z) and CAB#Z (for example, CAB0Z-CAB15Z).

The column main decoder CMDEC has 256 AND circuits which receive one of the pre-decode signals CAA#Z and one of the pre-decode signals CAB#Z. The column main decoder CMDEC outputs the high-level column line select signal CLZ (any one of CL0Z-CL255Z) from one of the AND circuits receiving the high-level pre-decode signal CAA#Z and CAB#Z in the high-level (active) period of the column pulse signal CLPZ. The number of the column line select signals CLZ is not limited to 256. The column pre-decoder CPDEC and the column main decoder CMDEC are one example of the address decoder that decodes the address signals AD supplied to select the bit line pair BL and /BL.

The column clock buffer CCLKB, the column address latch circuit CALT, and the column pre-decoder CPDEC operate in a period when the internal power supply voltage VIIC is generated and stop operations in a period when the internal power supply voltage VIIC is not generated. The column timing control circuit CTCNT and the column main decoder CMDEC operate as they receive the internal power supply voltage VIIR generated in a period except in the deep power-down mode. The column timing control circuit CTCNT receives the low-level column control signal CASPZ in the period when the internal power supply voltage VIIC is not generated, to set the column pulse signal CLPZ to the low level. The column main decoder CMDEC receives the low-level column pulse signal CLPZ in the period when the internal power supply voltage VIIC is not generated, to set all of the column line select signals CLZ to the low level. Accordingly, it is possible to prevent the column main decoder CMDEC from malfunctioning when the column clock buffer CCLKB, the column address latch circuit CALT, and the column pre-decoder CPDEC are stopped in operation.

FIG. 10 illustrates an example of operations of the semiconductor memory MEM illustrated in FIG. 2. In this example, the semiconductor memory MEM receives the activate command ACT, the write command WR or the read command RD, and the pre-charge command PRE in sequence. In response to the write command WR or the read command RD, write or read operations are performed respectively. The mode register 18 illustrated in FIG. 2 stores the burst length BSTL=4 and the latency CASL=3, to output a burst signal BSTLZ denoting the burst length BSTL and the latency signal CASLZ denoting the latency CASL.

The power control circuit PWCNT illustrated in FIG. 5 activates the power-on signal PONZ to the high level in accordance with the activate signal ACTZ which is activated in response to the active command ACT ((a) of FIG. 10). The power supply control unit 24 illustrated in FIG. 4 activates the start-up signal CONX to the low level in response to the activation of the power-on signal PONZ. Accordingly, the pMOS transistor P3 in the column voltage generation unit 30 is turned on to start generation of the internal power supply voltage VIIC and raise the internal power supply voltage VIIC ((b) of FIG. 10).

A time T1 in which the internal power supply voltage VIIC rises to a first voltage V1 is determined taking into account a time tRCD (RAS-to-CAS delay time), which is one of the operation specifications of the semiconductor memory MEM. The time tRCD is a minimum time that elapses from the activation of the row address strobe signal /RAS to the activation of the column address strobe /CAS. In other words, the time tRCD a minimum time from the activate command ACT to the write command WR or the read command RD.

For example, the column voltage generation unit 30 is designed such that the internal power supply voltage VIIC may reach the same first voltage V1 as the internal power supply voltage VIIR before the command control unit 16 receives the write command WR or the read command RD. The time T1 is determined by the load capacity of the internal power supply line VIIC and the voltage generation capacity of the column voltage generation unit 30. The internal power supply line VIIC is connected to the column control unit 36, the output data control unit 40, and the input data control unit 42 and has a load capacity smaller than the internal power supply line VIIR. Accordingly, the time T1 is reduced easily. In such a manner, the scale of the circuit supplied with the internal power supply voltage VIIC is determined to satisfy the time T1.

The timer TMR illustrated in FIG. 6 activates the power-on signal PONZ to the high level after a predetermined delay time tDLY elapses since the activation of the activation of the power-on signal PONZ ((c) of FIG. 10). The power supply control unit 24 illustrated in FIG. 4 activates the short-circuit signal SWONX to the low level in response to the activation of the power-on signal PONZ ((d) of FIG. 10). Accordingly, the switch 32 illustrated in FIG. 4 is turned on to interconnect the internal power supply voltages VIIR and VIIC which have the same value. The delay time tDLY is designed such that the switch 32 may be turned on before the timer tRCD elapses after the internal power supply voltage VIIC rose to the first voltage V1.

In a period when the internal power supply voltages VIIR and VIIC are connected to each other because the switch 32 is turned on, power dissipated by the column control unit 36, the output data control unit 40, and the input data control unit 42 is supplied not only from the internal power supply line VIIC but also from the internal power supply line VIIR. It prevents a drop in voltage of the internal power supply line VIIC as well as a leakage current. Since the value of the internal power supply voltage VIIC is stabilized, it is possible to prevent fluctuations in timing of generation of the signals in the column control unit 36, the output data control unit 40, and the input data control unit 42.

If the delay time tDLY is short such that the switch 32 may be turned on before the internal power supply voltage VIIC reaches the first voltage V1, the internal power supply voltage VIIR drops due to charge sharing ((e) of FIG. 10). A drop in internal power supply voltage VIIR may affect the circuits operating in response to the activate command ACT. For example, the timing at which the row control unit 34 illustrated in FIG. 2 activates the word line signal WLZ and the sense-amplifier control signal SAEZ may possibly shift. Therefore, it is desirable that the switch 32 may be turned on after the word line signal WLZ and the sense-amplifier control signal SAEZ are activated.

If the delay time tDLY is long such that the switch 32 may be turned on after the write command WR or the read command RD is accepted by the command control unit 16, a deficiency may occur in capacity of supplying power to the column control unit 36, the output data control unit 40, and the input data control unit 42 ((f) of FIG. 10). In this case, the internal power supply voltage VIIC drops. Moreover, after the switch 32 is turned on, the internal power supply voltage VIIR drops due to charge sharing. A drop in internal power supply voltage VIIR may affect the operations of the column control unit 36, the output data control unit 40, and the input data control unit 42. For example, the timing at which the input data latch circuit IDLT in the input data control unit 42 illustrated in FIG. 7 latches the input data signal DINZ may possibly shift. Therefore, it is desirable that the switch 32 may be turned on before the column control unit 36, the output data control unit 40, and the input data control unit 42 start to operate, that is, before the write command WR or the read command RD is accepted.

The semiconductor memory MEM sequentially receives the write command WR as well as the number of write data pieces WD1, WD2, WD3, and WD4 that corresponds to the burst length, thereby performing write operations ((g) of FIG. 10). When having received the read command RD, the semiconductor memory MEM performs read operations to sequentially output read data pieces RD1, RD2, RD3, and RD4 after the number of clock cycles that corresponds to the latency CASL (CASL=3 in FIG. 10) elapse ((h) of FIG. 10). In the write and read operations, the semiconductor memory MEM starts operating the column control unit 36, the output data control unit 40, and the input data control unit 42 supplied with the internal power supply voltage VIIC after the time tRCD elapses.

For example, in the read operations, the pre-charge command PRE is supplied to the previous one of the clock cycle in which the last read data RD4 is output ((i) of FIG. 10). In response to the activation of the pre-charge signal PREZ, the power control circuit PWCNT illustrated in FIG. 5 activates the power-off signal POFFZ after the number of the clock cycles which is a total of the latency CASL (=3) and the value N (=4) elapse ((j) of FIG. 10).

The number of the clock cycles which corresponds to the latency CASL are awaited taking into account the timing at which the last read data (RD4 in this example) is output. For example, the worst output timing for the last read data is two clock cycles after the pre-charge command PRE.

The N number of the clock cycles are awaited taking into account that the activate command ACT is supplied again after the pre-charge command PRE. The activate command ACT following the pre-charge command PRE is often supplied within, for example, the five clock cycles since the pre-charge command PRE is supplied. As described above, if the activate command ACT is supplied, the internal power supply voltage VIIC starts to be generated to turn on the switch 32.

In a period in which the activate command ACT is likely to be supplied, the switch 32 is prevented from being turned off, whereby frequent operations of the column voltage generation unit 30 and the switch 32 is avoided. As a result, the switch 32 is prevented from being turned on/off in a short cycle, thereby preventing fluctuations in internal power supply voltages VIIC and VIIR. On the other hand, when the active command ACT is input within the 5 clock cycles from the active (H-level) precharge command PREZ, the power off signal POFFZ is not activated, the switch 32 does not turn off. The value N may be set to match the time tRP (RAS precharge time), which is one of the operation specifications of the semiconductor memory MEM. The time tRP is the minimum time elapsing from supply of the pre-charge command PRE to that of the next activate command ACT.

The power control circuit PWCNT deactivates the power-on signal PONZ in response to the power-off signal POFFZ ((k) of FIG. 10). The power supply control unit 24 illustrated in FIG. 4 deactivates the short-circuit signal SWONX in response to the deactivation of the power-on signal PONZ ((l) of FIG. 10). That is, the power supply control circuit PWCNT deactivates the short-circuit signal SWONX if it does not receive the activate command ACT in a predetermined period since the completion of access operations. The switch 32 illustrated in FIG. 4 is turned off in response to the deactivation of the short-circuit signal SWONX, thereby releasing interconnection of the internal power supply lines VIIR and VIIC.

Subsequently, the column voltage generation unit 30 illustrated in FIG. 4 deactivates the start-up signal CONX in response to the deactivation of the short-circuit signal SWONX ((m) of FIG. 10). In response to the deactivation of the start-up signal CONX, the pMOS transistor P3 is turned off to stop generation of the internal power supply voltage VIIC, thereby gradually lowering the internal power supply voltage VIIC ((n) of FIG. 10). Along with the decrease in level of the internal power supply voltage VIIC, the operations stop of the column control unit 36, the output data control unit 40, and the input data control unit 42 which are supplied with the internal power supply voltage VIIC.

A period in which the internal power supply voltage VIIC is dissipated owing to the operations of the column control unit 36, the output data control unit 40, and the input data control unit 42 covers a time when the write command WR or the read command RD is received to a time when the write or read operations are completed respectively. By stopping the generation of the internal power supply voltage VIIC in a period when none of the column control unit 36, the output data control unit 40, and the input data control unit 42 operates, the dissipation power of the semiconductor memory MEM is reduced.

For example, the period when the start-up signal CONX is activated at the low level is that of the normal mode in which the internal power supply voltage VIIC is generated. The period when the start-up signal CONX is deactivated at the high level is that of the low-dissipation power mode in which the generation of the internal power supply voltage VIIC is stopped.

As hereinabove described, the present embodiment provides almost the same effects as those by the earlier described embodiments. Moreover, the switch 32 is turned on after the internal power supply voltage VIIC rises to the first voltage V1 and before the column control unit 36, the output data control unit 40, and the input data control unit 42 start to operate. It is thus possible to prevent fluctuations in internal power supply voltage VIIC, thereby preventing a shift in timing at which the row control unit 34 activates the word line signal WLZ and the sense-amplifier control signal SAEZ. Further, when the switch 32 is turned on, the internal power supply voltage VIIR is supplied to the internal power supply line VIIC, thereby enabling stabilizing the internal power supply voltage VIIC. It is thus possible to prevent a shift in timing at which the input data latch circuit IDLT in the input data control unit 42 latches the input data signal DINZ. That is, it is possible to prevent operations of the column control unit 36, the output data control unit 40, and the input data control unit 42 from being affected.

The power control circuit PWCNT in the power supply control unit 24 keeps the switch 32 in the on-state until a predetermined period elapses after the access operations are completed. In a period in which the activate command ACT is likely to be supplied, the switch 32 is prevented from being turned off, whereby frequent operations of the column voltage generation unit 30 and the switch 32 is avoided. As a result, it is possible to prevent the switch 32 from being turned on/off in a short cycle, thereby preventing fluctuations in internal power supply voltages VIIC and VIIR.

Figure 11:
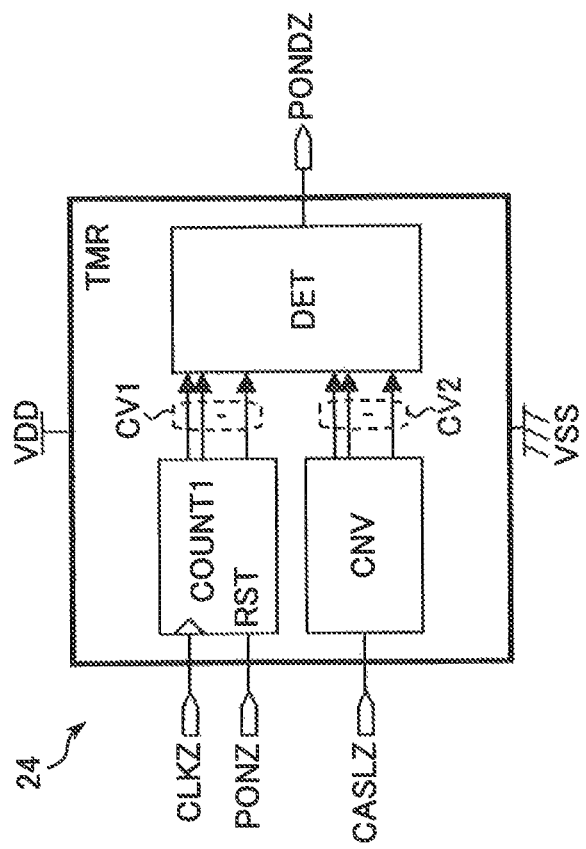
FIG. 11 illustrates an example of the timer TMR in the power supply control unit 24 in a further embodiment.

FIG. 11 illustrates an example of the timer TMR in the power supply control unit 24 in a further embodiment. Identical reference numerals are given to identical components in those embodiments, and repetitive detailed description on the identical components will be omitted. A timer TMR is formed in place of the timer TMR in the power supply control unit 24 illustrated in FIG. 4. The other components of a semiconductor memory MEM are the same as those in FIG. 2.

The timer TMR has a counter COUNT1, a conversion circuit CNV, and a detection circuit DET. The counter COUNT1 sets a counter value CV1 to zero when it is receiving a L-level (inactive) power-on signal PONZ at a reset terminal RST. When the power-on signal PONZ is at the high level (active), the counter COUNT1 performs count operations in, for example, synchronization with the leading edge of a clock signal CLKZ to increment the counter value CV1 by one each time. That is, the counter COUNT1 counts the number of clock cycles during the power on signal PONZ is active (H-level).

The conversion circuit CNV converts a value denoted by a latency signal CASLZ into a predetermined value CV2. For example, the predetermined value CV2 takes on a value obtained by subtracting one from the value denoted by the latency signal CASLZ (that is, a latency CASL). The detection circuit DET activates the power-on signal PONDZ if it detects that the counter value CV1 and the predetermined value CV2 agree. The power-on signal PONDZ is activated in the previous one of the clock cycle in which a write command WR or a read command RD is supplied as illustrated in FIG. 10.

The counter COUNT1 may perform count operations in synchronization with the trailing edge of the clock signal CLKZ. In this case, the conversion circuit CNV sets the predetermined value CV2 to the same value as that denoted by the latency signal CASLZ. In this case, the power-on signal PONDZ is activated 0.5 clock cycle before the clock cycle in which the write command WR or the read command RD illustrated in FIG. 10 is supplied. In such a manner, the semiconductor memory MEM is operated by using the timer TMR illustrated in FIG. 11 almost at the same timing as that in FIG. 10. The predetermined value CV2 has been described above to be the same as or a value smaller by one than the latency CASL; however, more specifically, by converting the predetermined value into a value obtained by subtracting a control delay time from the number of clock pulses in a time tRCD, it is possible to realize operations of the timer TMR that match the present embodiment.

The present embodiment provides almost the same effects as those by the earlier described embodiments. Moreover, by counting the clock cycles without using the delay circuit DLYT by use of a time constant illustrated in FIG. 6, it is possible to generate a power-on signal PONDZ from the power-on signal PONZ. It is thus possible to generate the power-on signal PONDZ always at constant timing irrespective of fluctuations in characteristics of elements formed in the semiconductor memory MEM. The memory is adjusted finer the higher the frequency is of the activation timing clock signal CLK for the power-on signal PONDZ.

Figure 12:
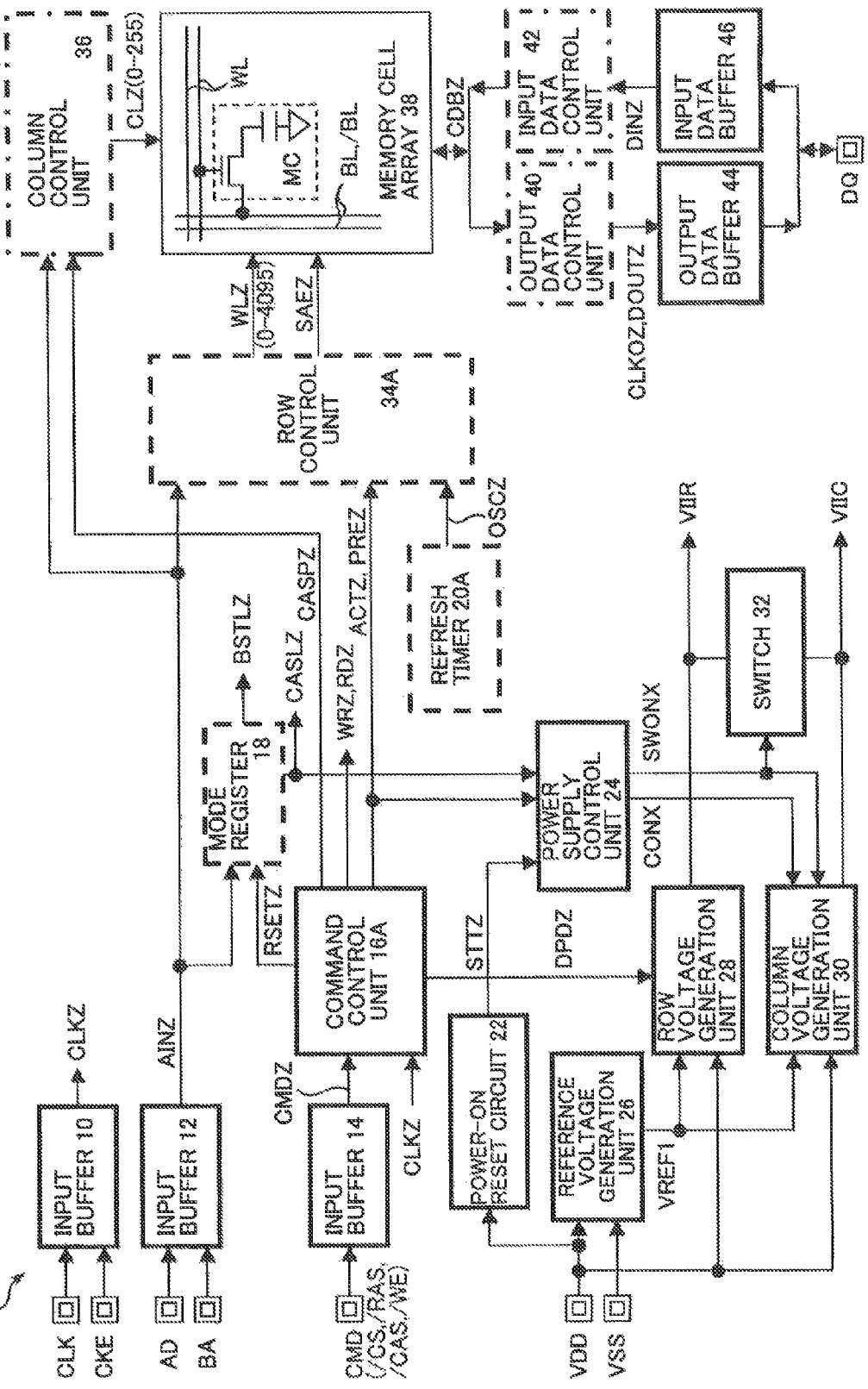
FIG. 12 illustrates an example of a semiconductor memory MEM in a still further embodiment.

FIG. 12 illustrates an example of a semiconductor memory MEM in a still further embodiment. Identical reference numerals are given to identical components in those embodiments, and repetitive detailed description on the identical components will be omitted. The semiconductor memory MEM has a command control unit 16A, a refresh timer 20A, and a row control unit 34A in place of the command control unit 16, the refresh timer 20, and the row control unit 34 respectively in FIG. 2. The other components of the semiconductor memory MEM are the same as those in FIG. 2.

The command control unit 16A is obtained by deleting the function to decode a self-refresh command and the function to generate an auto refresh signal AREFZ and a self-refresh signal SREFZ from the command control unit 16 in FIG. 2. That is, the semiconductor memory MEM automatically performs refresh operations without receiving a command from the outside and does not have the self-refresh mode.

The refresh timer 20A outputs an oscillation signal OSCZ always at a predetermined cycle without receiving the self-refresh signal SREFZ. The row control unit 34A has a function to determine priority order between an activate command ACT and the oscillation signal OSCZ (refresh request) if they compete against each other. An example of the row control unit 34A is illustrated in FIG. 13.

Figure 13:
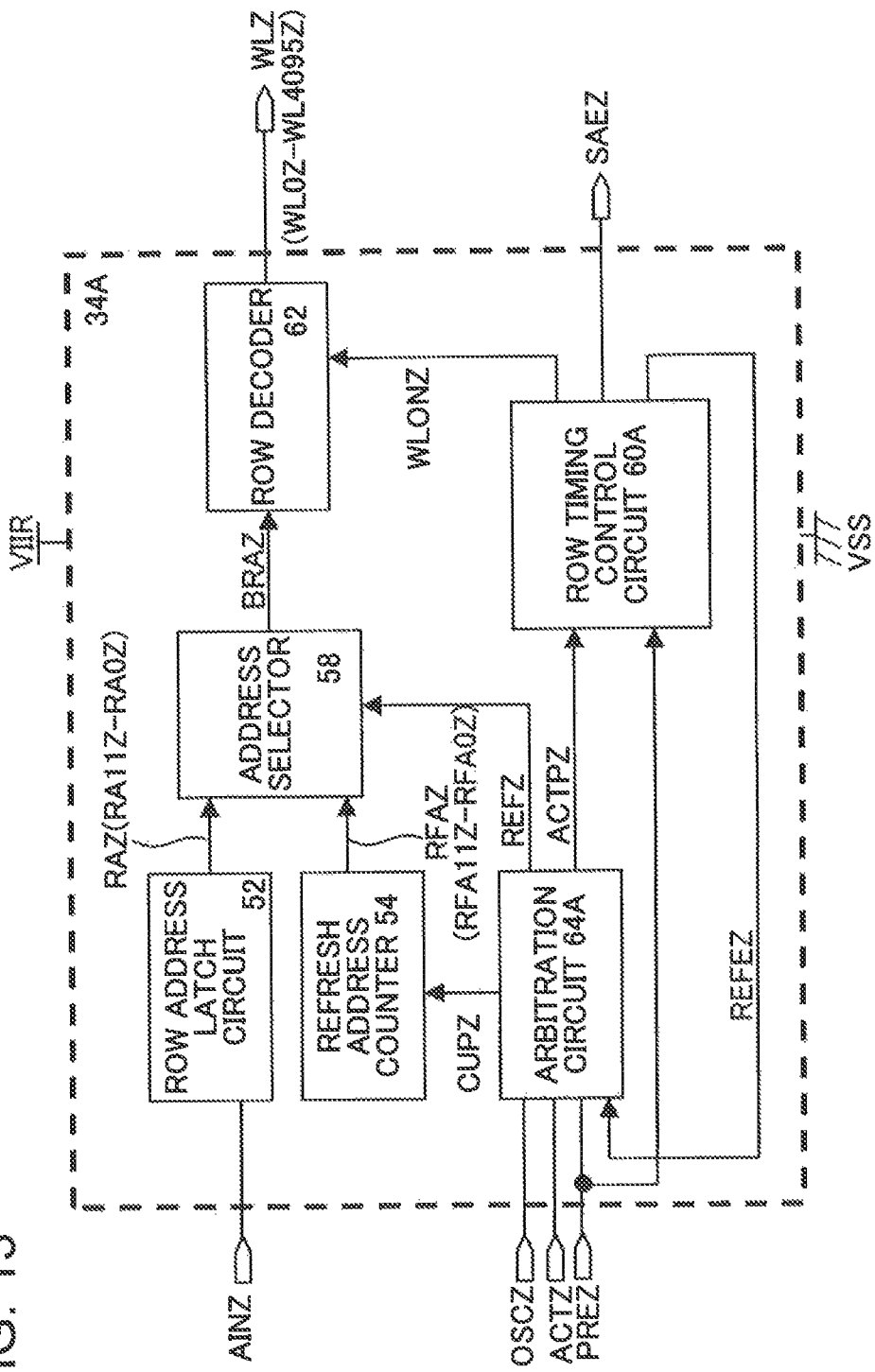
FIG. 13 illustrates an example of the row control unit 34A illustrated in FIG. 12.

FIG. 13 illustrates an example of the row control unit 34A illustrated in FIG. 12. The row control unit 34A has an arbitration circuit 64A and a row timing control circuit 60A in place of the refresh request generation circuit 56 and the row timing control circuit 60 in the row control unit 34 illustrated in FIG. 3 respectively. The other components of the row control unit 34A are the same as those of the row control unit 34 illustrated in FIG. 3.

If having received the oscillation signal OSCZ earlier than the activate signal ACTZ, the arbitration circuit 64A outputs a refresh signal REFZ, a count-up signal CUPZ, and an activate pulse signal ACTPZ, to hold activation information of the activate signal ACTZ. For example, the activate pulse signal ACTPZ is a pulse signal. The arbitration circuit 64A deactivates the refresh signal REFZ in response to the activation of a refresh end signal REFEZ from the row timing control circuit 60A, to activate the activate pulse signal ACTPZ based on the held activation information of the activate signal ACTZ.

If having received the activate signal ACTZ earlier than the oscillation signal OSCZ, the arbitration circuit 64A activates the activate pulse signal ACTPZ to hold the activation information of the oscillation signal OSCZ. If having received the activation of the pre-charge signal PREZ, the arbitration circuit 64A outputs the refresh signal REFZ, the count-up signal CUPZ, and the activate pulse signal ACTPZ based on the held activation information of the oscillation signal OSCZ.

The row timing control circuit 60A is the same as the row timing control circuit 60 illustrated in FIG. 3 except that it receives the activate pulse signal ACTPZ in place of the activate signal ACTZ and the refresh pulse signal REFPZ. Operations of the semiconductor memory MEM of the present embodiment are the same as those in FIG. 10.

The present embodiment described hereinabove provides almost the same effects as the embodiments described earlier. Moreover, since the refresh operations are performed automatically, even in the semiconductor memory MEM having the arbitration circuit 64A, it is possible to prevent fluctuations in internal power supply voltages VIIR and VIIC and, at the same time, minimize both of the function of the row voltage generation unit 28 to generate the internal power supply voltage VIIR and the function of the column voltage generation unit 30 to generate the internal power supply voltage VIIC. As a result, the dissipation power of the semiconductor memory MEM is reduced.

Figure 14:
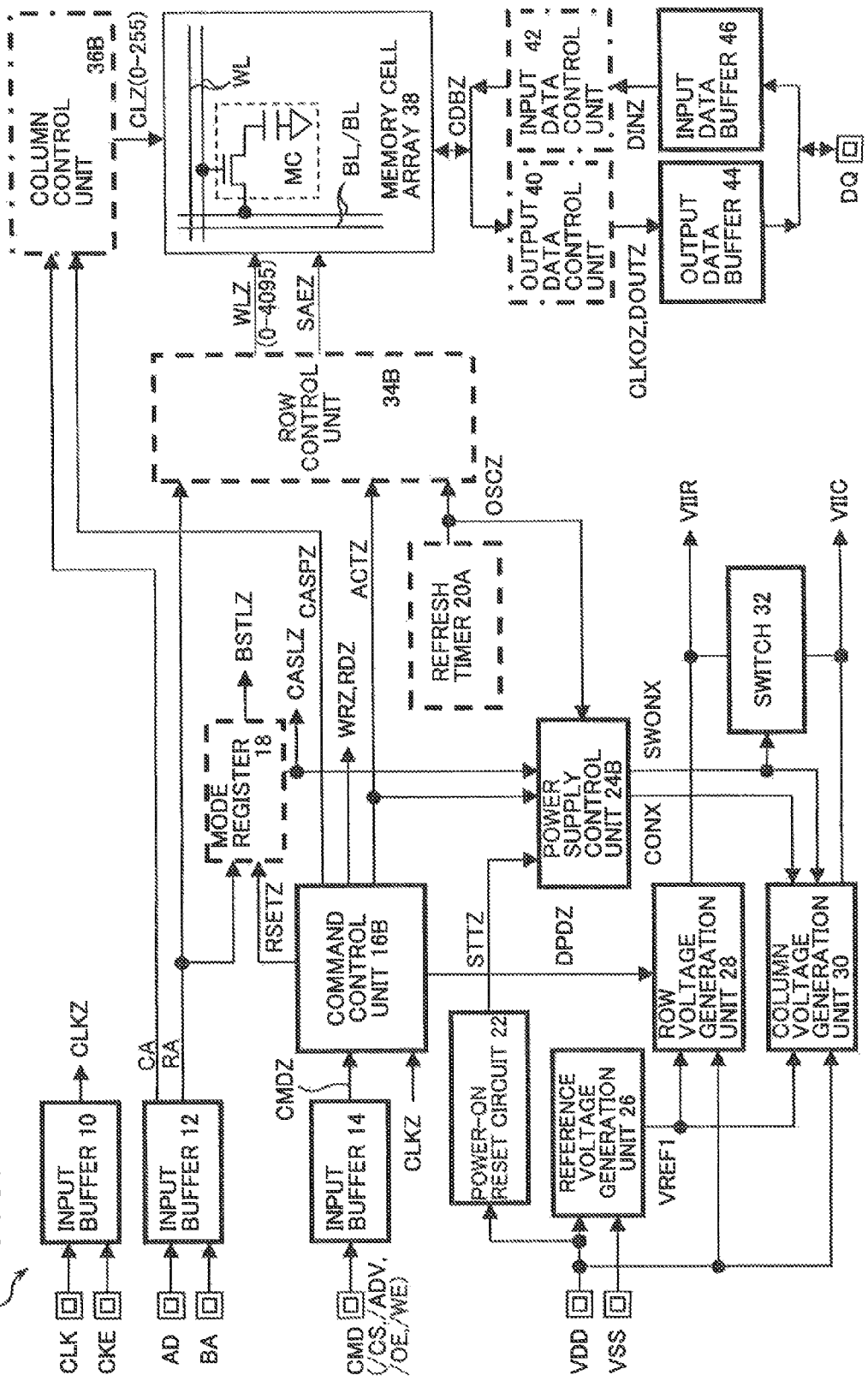
FIG. 14 illustrates an example of a semiconductor memory MEM in an additional embodiment.

FIG. 14 illustrates an example of a semiconductor memory MEM in an additional embodiment. Identical reference numerals are given to identical components in the embodiments, and repetitive detailed description on the identical components will be omitted. The semiconductor memory MEM has an input buffer 12B, a command control unit 16B, a refresh timer 20A, a power supply control unit 24B, a row control unit 34B, and a column control unit 36B in place of the input buffer 12, the command control unit 16, the refresh timer 20, the power supply control unit 24, the row control unit 34, and the column control unit 36 which are illustrated in FIG. 2. The refresh timer 20A is the same as that in FIG. 12.

The other components of the semiconductor memory MEM are the same as those in FIG. 2.

The semiconductor memory MEM illustrated in FIG. 14 is a pseudo static random access memory (SRAM). The pseudo SRAM has DRAM memory cells MC and an SRAM interface to automatically refresh the memory cells MC. Further, the semiconductor memory MEM employs an address non-multiplex type in which a row address signal RA and a column address signal CA are received simultaneously at different address terminals AD. That is, the input buffer 12B receive the row address signal RA and the column address signal CA simultaneously.

The command control unit 16B recognizes a write command, a read command, and a register set command in response to a command signal CMDZ. When having recognized the write command, the command control unit 16B activates an activate signal ACTZ and then activates a write signal WRZ and a column control signal CASPZ. When having recognized the read command, the command control unit 16B activates the activate signal ACTZ and then activates a read signal RDZ and the column control signal CASPZ.

A deep power-down signal DPDZ is deactivated when a clock signal CLKZ is received and activated when the clock signal CLKZ is not received. The command control unit 16B and the other components are the same as the command control unit 16 in FIG. 2 except that they recognize none of the activate command, a pre-charge command, an auto refresh command, and a self-refresh command and generate none of a pre-charge signal PREZ, an auto refresh signal AREFZ, and a self-refresh signal SREFZ.

The input buffer 14 receives a chip select signal /CS, an address valid signal /ADV, and an output enable signal /OE as a command signal CMD in place of the chip select signal /CS, the row address strobe signal /RAS, and the column address strobe signal /CAS in FIG. 2.

The power supply control unit 24B uses an oscillation signal OSCZ in place of the pre-charge signal PREZ to determine timing to deactivate a start-up signal CONX and a short-circuit signal SWONX. The timing at which the power supply control unit 24B activates the start-up signal CONX and the short-circuit signal SWONX is the same as the timing at which the power supply control unit 24 activates the start-up signal CONX and the short-circuit signal SWONX illustrated in FIG. 2.

The row control unit 34B is the same as the row control unit 34A in FIG. 13 except that it receives a column end signal CLENDZ in place of the pre-charge signal PREZ illustrated in FIG. 2 to deactivate a word line signal WLZ and a sense-amplifier control signal SAEZ. The column control unit 36B adds a function to generate the column end signal CLENDZ to the column control unit 36 illustrated in FIG. 2. The column end signal CLENDZ is a pulse signal which is activated in response to the end of write and read operations.

Figure 15:
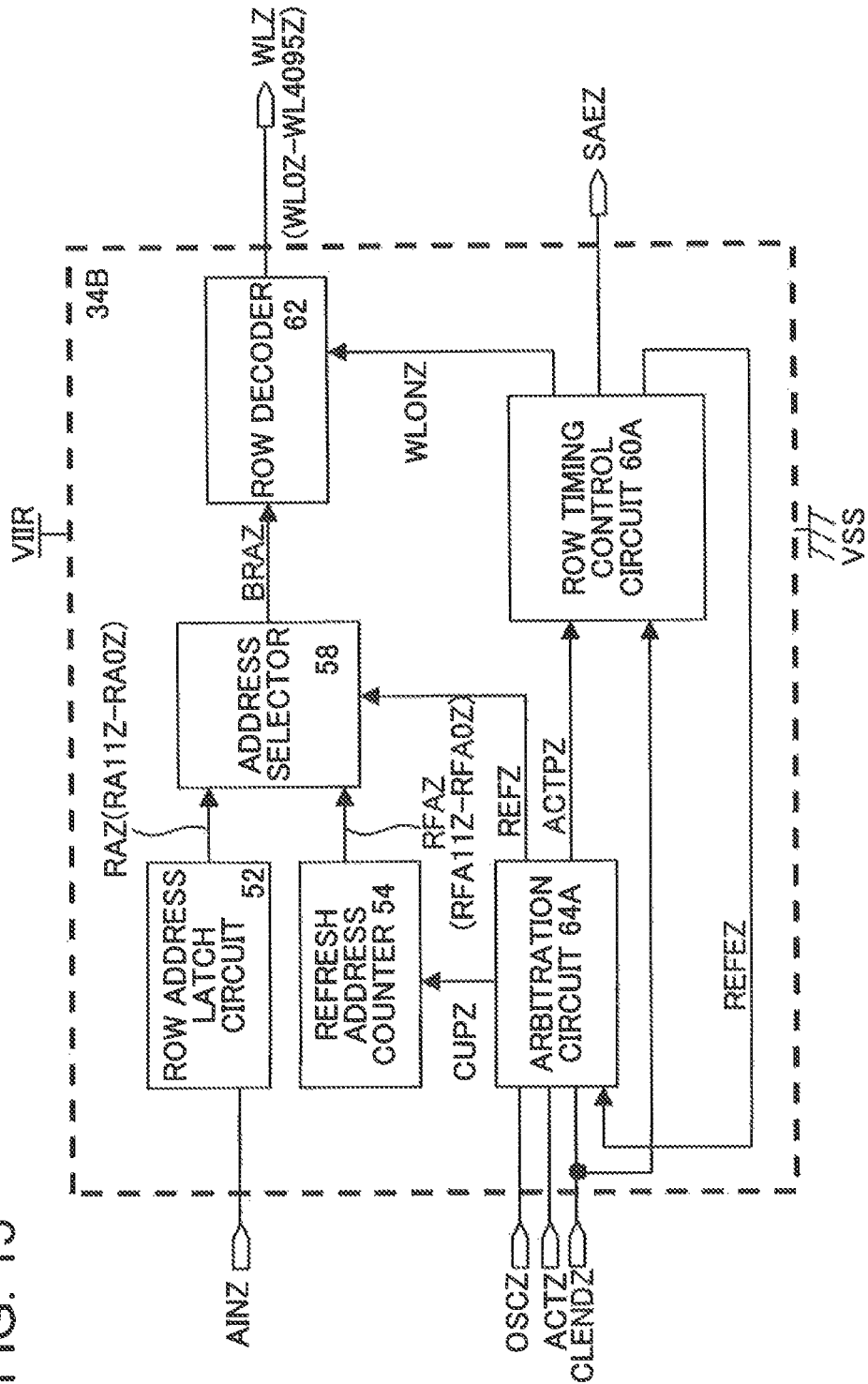
FIG. 15 illustrates an example of the row control unit 34B illustrated in FIG. 14.

FIG. 15 illustrates an example of the row control unit 34B illustrated in FIG. 14. As described above, the row control unit 34B is the same as the row control unit 34A in FIG. 13 except that it receives the column end signal CLENDZ in place of the pre-charge PREZ.

Figure 16:
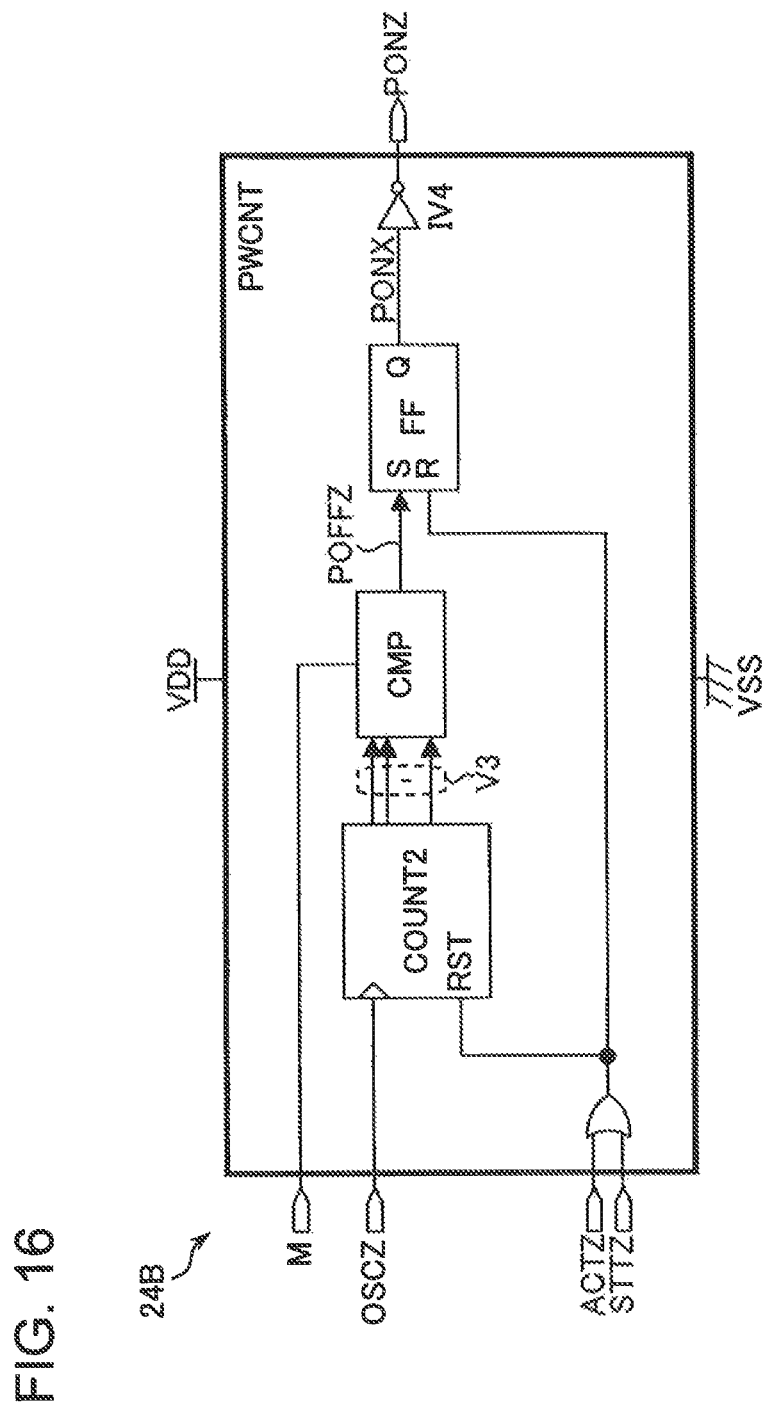
FIG. 16 illustrates an example of a power control circuit PWCNT in the power supply control unit 24B illustrated in FIG. 14.

FIG. 16 illustrates an example of a power control circuit PWCNT in the power supply control unit 24B illustrated in FIG. 14. The power supply control unit 24B is the same as the power supply control unit 24 illustrated in FIG. 4 except for the power control circuit PWCNT. The power supply control unit 24B has the timer TMR illustrated in FIG. 6 or the timer TMR illustrated in FIG. 11.

The power control circuit PWCNT has a counter COUNT2, a comparator CMP, a flip-flop FF, and an inverter IV4. The counter COUNT2 resets a counter value V3 to zero in synchronization with the leading edge of a signal received at a reset terminal RST and increments the counter value V3 by one each time in synchronization with the oscillation signal OSCZ. The reset terminal RST receives an OR logic of the activate signal ACTZ and a starter signal STTZ.

The comparator CMP activates a power-on signal PONZ to the high level if the counter value V3 from the counter COUNT2 agrees with an expected value M. For example, the expected value M is set to a fixed value "3" and programmed beforehand by a photo-mask wiring pattern, a fuse circuit, etc. used to manufacture the semiconductor memory MEM. The flip-flop FF outputs a high-level power-on signal PONX from an output terminal Q if it is supplied with a high-level power-off signal POFFZ at a set terminal S. The flip-flop FF outputs the low-level power-on signal PONX if it is supplied with at the reset terminal R the high-level activate signal ACTZ or the high-level starter signal STTZ power via an OR circuit. The inverter IV4 inverts the logic of the power-on signal PONX to output it as the power-on signal PONZ.

Figure 17:
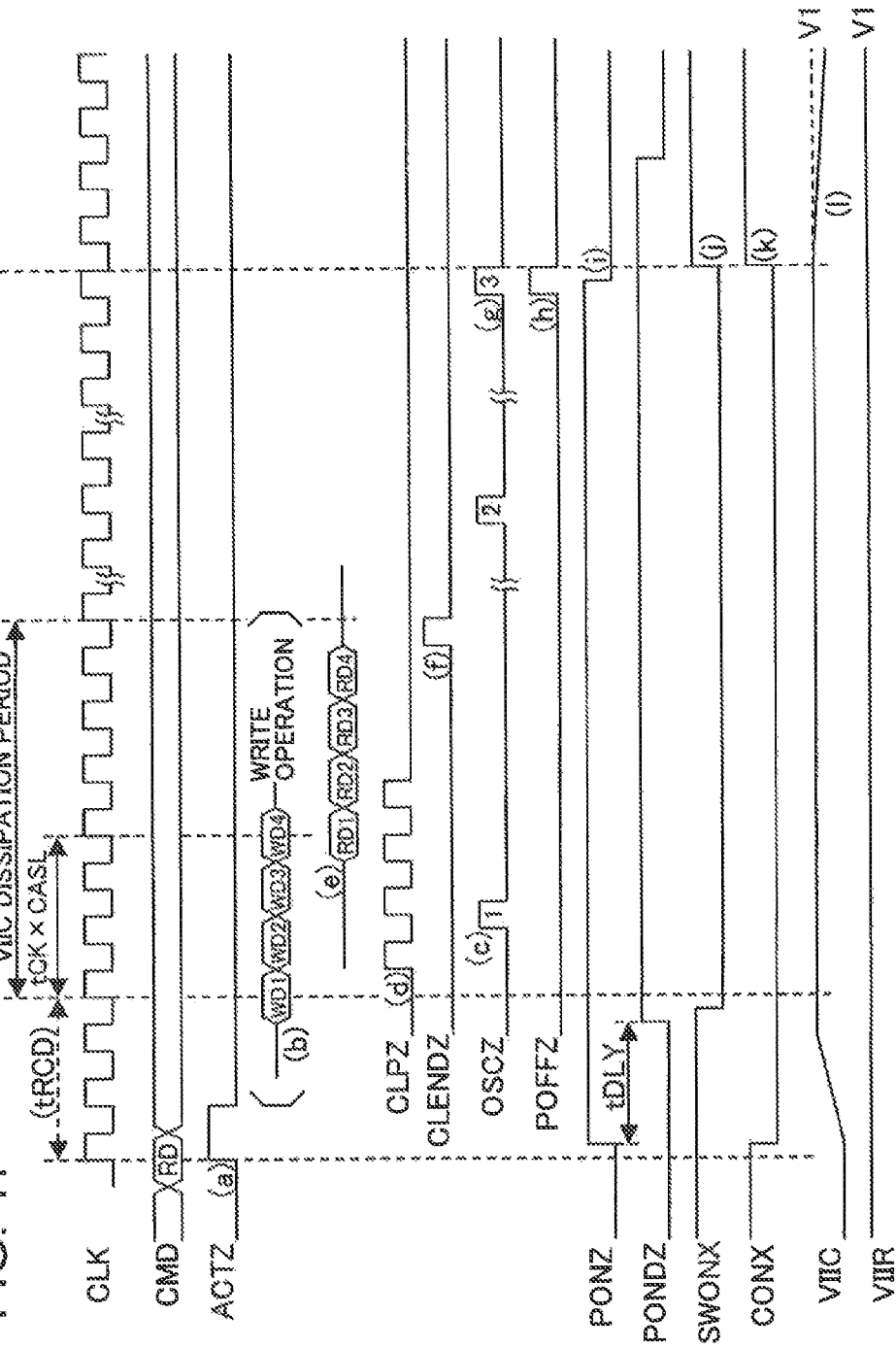
FIG. 17 illustrates an example of operations of the semiconductor memory MEM illustrated in FIG. 14.

FIG. 17 illustrates an example of operations of the semiconductor memory MEM illustrated in FIG. 14. Detailed description of the same operations as those in FIG. 10 will be omitted. FIG. 17 illustrates an example when read operations are performed. Since the semiconductor memory MEM of the present embodiment is a pseudo SRAM, a write command WR or a read command RD is received in place of the activate command ACT in FIG. 10. The mode register 18 illustrated in FIG. 14 stores the burst length BSTL=4 and the latency CASL=3, to output a burst signal BSTLZ denoting the burst length BSTL and a latency signal CASLZ denoting the latency CASL.

The semiconductor memory MEM activates the activate signal ACTZ in response to a read command RD ((a) of FIG. 17). In write operations, due to latency control, the first write data WD1 is supplied a time tRCD later than a write command WR ((b) of FIG. 17). Operations from a time when the activate signal ACTZ is activated to a time when the short-circuit signal SWONX is activated to the low level are the same as those in FIG. 10 except for the operations of the power control circuit PWCNT illustrated in FIG. 16.

The power control circuit PWCNT resets the counter value V3 in response to the activation of the activate signal ACTZ, to start count operations by use of the oscillation signal OSCZ ((c) of FIG. 17). If the oscillation signal OSCZ (refresh request) is generated during read operations, the arbitration circuit MA illustrated in FIG. 15 prohibits activation of the refresh signal REFZ until the read operations are completed, thereby holding the refresh request. Therefore, refresh operations are not started during the read operations.

As in FIG. 10, the semiconductor memory MEM starts operating the column control unit 36B, the output data control unit 40, and the input data control unit 42 illustrated in FIG. 14 after a time corresponding to the time tRCD elapses. In read operations, the column control unit 36B generates a column pulse signal CLPZ (FIG. 9) after the number of clock cycles which corresponds to the time tRCD elapses ((d) of FIG. 17). The output data control unit 40 sequentially outputs read data pieces RD1, RD2, RD3, and RD4 provided by the memory cell array 38 later than each column pulse signal CLPZ by the latency CASL ((e) of FIG. 17). The column control unit 36B activates the column end signal CLENDZ in response to completion of the output of the last read data RD4 ((f) of FIG. 17).

In this example, the third oscillation signal OSCZ is output after the completion of the read operations and before the new read command RD or write command WR is supplied to the semiconductor memory MEM ((g) of FIG. 17). In response to the third oscillation signal OSCZ, the power control circuit PWCNT illustrated in FIG. 16 temporarily activates the power-off signal POFFZ and deactivates the power-on signal PONZ ((h), (i) of FIG. 17). Then, as in FIG. 10, the power control unit 24B deactivates the short-circuit signal SWONX in response to the deactivation of the power-on signal PONZ ((j) of FIG. 17). The switch 32 is turned off in response to the deactivation of the short-circuit signal SWONX, to release interconnection of the internal power supply lines VIIR and VIIC.

Subsequently, the start-up signal CONX is deactivated in response to the deactivation of the short-circuit signal SWONX, to turn off the pMOS transistor P3 ((k) of FIG. 17). The internal power supply voltage VIIC decreases gradually ((l) of FIG. 17). Then, operations of the column control unit 36B, the output data control unit 40, and the input data control unit 42 which are supplied with the internal power supply voltage VIIC are stopped.

As may be seen from the above, according to the present embodiment also, almost the same effects as those by the above embodiments is obtained. Moreover, also in the pseudo SRAM in which the operations of the row control unit 34B and those of the column control unit 36B are started in sequence in response to the read command RD and the write command WR, it is possible to prevent fluctuations in internal power supply voltages VIIR and VIIC and, at the same time, minimize the function of the row voltage generation unit 28 to generate the internal power supply voltage VIIR and the function of the column voltage generation unit 30 to generate the internal power supply voltage VIIC respectively. As a result, the dissipation power of the semiconductor memory MEM is reduced.

Figure 18:
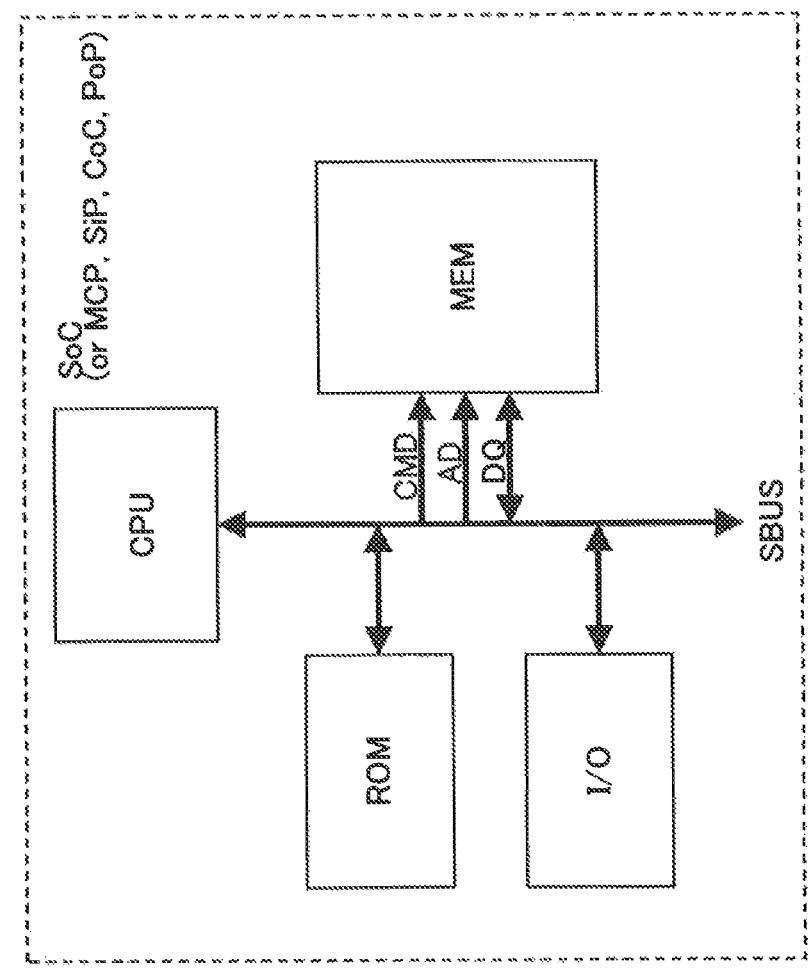
FIG. 18 illustrates an example of a system SYS mounted with the semiconductor memory MEM of the above embodiment.

FIG. 18 illustrates an example of a system SYS mounted with the semiconductor memory MEM of the above embodiment. The system SYS (user system) makes up at least one portion of the microcomputer system of, for example, a portable device. The system SYS has a system-on-chip SoC having a plurality of macros integrated on a silicon substrate. Alternatively, the system SYS has a multi-chip package MCP in which a plurality of chips are stacked on a package substrate. Further alternatively, the system SYS has a system-in-package SiP in which a plurality of chips are mounted on a package substrate such as a lead frame. Further, the system SYS may be given in the form of a chip-on-chip CoC or a package-on-package PoP.

For example, the SoC has a central processing unit (CPU), a read only memory (ROM), a peripheral circuit I/O, and the above-described semiconductor memory MEM. The CPU is one example of a controller that controls access to the semiconductor memory MEM. The CPU, the ROM, the peripheral circuit I/O, and the semiconductor memory MEM are connected to each other by a system bus SBUS. Between the CPU and the semiconductor memory MEM, a memory controller may be disposed.

The CPU gains access to the ROM, the peripheral circuit I/O, and the semiconductor memory MEM and controls operations of the system as a whole. The semiconductor memory MEM performs read and write operations in response to an access request from the CPU. The minimum configuration of the system SYS is the CPU and the semiconductor memory MEM.

The disclosures described in the above embodiments will be sorted out and disclosed as additional statements.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention has been described in detail, it should be understood that the various changes, substitutions, and alterations could be made hereto without departing from the spirit and scope of the invention.

What is claimed is:

1. A semiconductor memory comprising:
    memory cells disposed in a matrix;
    a first selection unit which selects any of first signal lines respectively connected to memory cell lines arranged in a first direction, in response to an access request to access the memory cells;
    a second selection unit which selects any of second signal lines respectively connected to the memory cell lines arranged in a second direction intersecting with the first direction, after the first selection unit starts operating;
    a first voltage generation unit which generates a first power supply voltage to be supplied to the first selection unit;
    a second voltage generation unit which generates a second power supply voltage to be supplied to the second selection unit, when a start-up signal is in an activating state;
    a switch which short-circuits a first power supply line supplied with the first power supply voltage and a second power supply line supplied with the second power supply voltage to each other, when a short-circuit signal is in the activating state; and
    a power supply voltage control unit which activates the start-up signal in response to the access request, activates the short-circuit signal after a predetermined time elapses since activation of the start-up signal, deactivates the short-circuit signal after completion of access operations based on the access request, and deactivates the start-up signal in response to deactivation of the short-circuit signal.

2. The semiconductor memory according to claim 1, wherein the power supply voltage control unit activates the short-circuit signal in a period after the second power supply voltage reaches a first voltage until the second selection unit starts operating.

3. The semiconductor memory according to claim 2, further comprising:
    a command control unit which receives a read/write request which denotes read operations or write operations after receiving the access request, wherein
    the first selection unit starts operating in response to the access request,
    the second selection unit starts operating in response to the read/write request, and
    the power supply voltage control unit activates the short-circuit signal in a period after the second power supply voltage reaches the first voltage until the read/write request reception.

4. The semiconductor memory according to claim 1, wherein the power supply voltage control unit comprises:
    a counter which counts the number of clock cycles following the access request; and
    a detection circuit which activates the short-circuit signal when the counter counts a predetermined times.

5. The semiconductor memory according to claim 4, comprising a register which sets the number of clock cycles in a period from a time when an internal circuit starts operating to a time when the internal circuit outputs a signal, wherein the power supply voltage control unit includes a conversion circuit which generates the predetermined value in accordance with a value set by the register.

6. The semiconductor memory according to claim 1, wherein the power supply voltage control unit comprises a delay circuit which activates the short-circuit signal after the predetermined time elapses since activation of the start-up signal.

7. The semiconductor memory according to claim 1, wherein the power supply voltage control unit deactivates the short-circuit signal when the power supply voltage control unit does not receive the access request for a predetermined period after completion of the access operations.

8. The semiconductor memory according to claim 1, wherein the second selection unit comprises an address decoder which decodes an address signal which is supplied to select the second signal line.

9. The semiconductor memory according to claim 1, wherein the second selection unit comprises a latch circuit which holds a data signal which is transmitted to the second signal line and input to and output from the memory cells.

10. A system comprising:
the semiconductor memory according to claim 1; and
a controller which controls access to the semiconductor memory.

11. A method of operating a semiconductor memory having memory cells disposed in a matrix, a first selection unit which selects any of first signal lines respectively connected to memory cell lines arranged in a first direction in response to an access request to gain access to the memory cells, a second selection unit which selects any of second signal lines respectively connected to the memory cell lines arranged in a second direction intersecting with the first direction after the first selection unit starts operating, and a switch which short-circuits a first power supply line supplying a first power supply voltage to the first selection unit and a second power supply line supplying a second power supply voltage to the second selection unit to each other when a short-circuit signal is in an activating state,
the method comprising:
generating the first power supply voltage to be supplied to the first selection unit;
activating a start-up signal when the access request to the memory cells is received;
generating the second power supply voltage to be supplied to the second selection unit when the start-up signal is in the activating state;
activating the short-circuit signal after a predetermined time elapses since activation of the start-up signal; and
deactivating the short-circuit signal after completion of access operations in response to the access request and deactivating the start-up signal in response to deactivation of the short-circuit signal.

12. The semiconductor memory operating method according to claim 11, wherein the short-circuit signal is activated in a period from a time when the second power supply voltage reaches a first voltage to a time when the second selection unit starts operating.

13. The semiconductor memory operating method according to claim 12, comprising:
receiving a read/write request which denotes read operations or write operations after receiving the access request, wherein
the first selection unit starts operating in response to the access request, and
the second selection unit starts operating in response to the read/write request,
the short-circuit signal being activated in a period from a time when the second power supply voltage reaches the first voltage to a time when the read/write request is received.

14. The semiconductor memory operating method according to claim 11, comprising activating the short-circuit signal when a counter which counts the number of clock cycles following the access request counts a predetermined times.

15. The semiconductor memory operating method according to claim 14, comprising generating the predetermined value in accordance with a value set by a register which sets the number of clock cycles to be given in a period from a time when an internal circuit starts operating to a time when the internal circuit outputs a signal.

16. The semiconductor memory operating method according to claim 11, comprising deactivating the short-circuit signal when the access request is not received for a predetermined period after completion of the access operations.

* * * * *